(12) United States Patent
Parry et al.

(10) Patent No.: US 11,237,612 B2
(45) Date of Patent: Feb. 1, 2022

(54) CHARGE-SHARING CAPACITIVE MONITORING CIRCUIT IN A MULTI-CHIP PACKAGE TO CONTROL POWER

(71) Applicant: Micron Technology, Inc., Boise, ID (US)

(72) Inventors: Jonathan S. Parry, Boise, ID (US); Stephen L. Miller, Boise, ID (US); Liang Yu, Boise, ID (US)

(73) Assignee: MICRON TECHNOLOGY, INC., Boise, ID (US)

( * ) Notice: Subject to any disclaimer, the term of this patent is extended or adjusted under 35 U.S.C. 154(b) by 334 days.

(21) Appl. No.: 16/548,639

(22) Filed: Aug. 22, 2019

(65) Prior Publication Data

US 2021/0055776 A1 Feb. 25, 2021

(51) Int. Cl.
| | | |
|---|---|---|
| *G06F 1/26* | (2006.01) | |
| *G06F 1/32* | (2019.01) | |
| *G11C 5/14* | (2006.01) | |
| *G11C 11/4074* | (2006.01) | |
| *H01L 23/00* | (2006.01) | |
| *G06F 1/3225* | (2019.01) | |
| *G06F 1/3212* | (2019.01) | |
| *G06F 1/3234* | (2019.01) | |

(52) U.S. Cl.
CPC .............. *G06F 1/3225* (2013.01); *G06F 1/26* (2013.01); *G06F 1/3212* (2013.01); *G06F 1/3234* (2013.01); *G06F 1/3275* (2013.01); *G11C 5/14* (2013.01); *G11C 11/4074* (2013.01); *H01L 23/00* (2013.01); *Y02D 10/00* (2018.01)

(58) Field of Classification Search
None
See application file for complete search history.

(56) References Cited

U.S. PATENT DOCUMENTS

| | | | |
|---|---|---|---|
| 6,140,863 | A | 10/2000 | Fujisawa |
| 7,472,296 | B2 | 12/2008 | Kato et al. |

(Continued)

FOREIGN PATENT DOCUMENTS

| | | |
|---|---|---|
| KR | 10-2009-0066680 A | 6/2009 |
| KR | 10-2011-0087274 A | 8/2011 |
| WO | 2015/025124 A1 | 2/2015 |

OTHER PUBLICATIONS

Notice of Allowance, U.S. Appl. No. 16/548,666, dated Jul. 2, 2021, 9 pages.

(Continued)

*Primary Examiner* — Tanh Q Nguyen
(74) *Attorney, Agent, or Firm* — Nicholson De Vos Webster & Elliott LLP

(57) ABSTRACT

A technique to provide power management for multiple dice. The technique provides for determining for each respective die of the multiple dice, power consumption for operating each respective die; and generating a respective signal from each respective die that corresponds to the power consumption of each respective die. The technique further provides for converting each respective signal to a respective analog voltage to drive a common node; and utilizing a charge storage device coupled to the common node to accumulate the respective analog voltages from the dice, where the accumulated voltage indicates total power consumption of the dice.

20 Claims, 14 Drawing Sheets

(56) References Cited

U.S. PATENT DOCUMENTS

| | | | |
|---|---|---|---|
| 7,978,518 B2* | 7/2011 | Pyeon | G11C 16/12 |
| | | | 365/185.17 |
| 8,060,765 B1 | 11/2011 | Cha et al. | |
| 8,799,683 B2 | 8/2014 | Chase | |
| 10,884,480 B1* | 1/2021 | Parry | G06F 1/3225 |
| 2005/0017321 A1* | 1/2005 | Hakkarainen | H01L 27/0805 |
| | | | 257/532 |
| 2005/0134305 A1 | 6/2005 | Stojanovic et al. | |
| 2008/0276110 A1 | 11/2008 | Indiani et al. | |
| 2009/0157929 A1 | 6/2009 | Pigott et al. | |
| 2010/0023903 A1 | 1/2010 | Pramono et al. | |
| 2010/0091537 A1 | 4/2010 | Best et al. | |
| 2011/0291733 A1 | 12/2011 | Yano | |
| 2012/0023346 A1 | 1/2012 | Byom et al. | |
| 2012/0198250 A1* | 8/2012 | Mizusawa | G06F 1/263 |
| | | | 713/300 |
| 2013/0321380 A1* | 12/2013 | Chuei | G09G 3/3466 |
| | | | 345/212 |
| 2014/0369116 A1 | 12/2014 | Koji | |
| 2016/0293264 A1 | 10/2016 | Al-Shamma et al. | |
| 2016/0371572 A1 | 12/2016 | Saiki et al. | |
| 2017/0060205 A1 | 3/2017 | Bharath et al. | |
| 2017/0192489 A1 | 7/2017 | Hance et al. | |
| 2019/0041938 A1 | 2/2019 | Zupanc et al. | |
| 2019/0079574 A1 | 3/2019 | Hanson et al. | |
| 2019/0220560 A1 | 7/2019 | Chhabra | |
| 2019/0222318 A1* | 7/2019 | Bai | H04B 10/40 |
| 2019/0235774 A1* | 8/2019 | Benisty | G06F 1/3275 |
| 2020/0284883 A1* | 9/2020 | Ferreira | G01S 7/4816 |
| 2020/0379546 A1* | 12/2020 | Cariello | G06F 3/0625 |
| 2021/0011538 A1* | 1/2021 | Parry | G06F 13/1605 |
| 2021/0055776 A1* | 2/2021 | Parry | G06F 1/3225 |
| 2021/0057279 A1* | 2/2021 | Parry | H01L 25/50 |
| 2021/0067385 A1* | 3/2021 | Finn | G11C 29/028 |

OTHER PUBLICATIONS

International Search Report and Written Opinion, PCT/US2020/045491, dated Nov. 20, 2020, 10 pages.

International Search Report and Written Opinion, PCT/US2020/046243, dated Nov. 20, 2020, 9 pages.

Restriction Requirement Office Action, U.S. Appl. No. 16/548,666, dated Nov. 18, 2020, 7 pages.

International Search Report and Written Opinion, PCT/US2020/045396, dated Nov. 5, 2020, 11 pages.

Session 13 Non-Volatile Memories ISSCC 2019, International Solid-State Circuits Conference, 2019 IEEE, 170 pages.

Non-Final Office Action, U.S. Appl. No. 16/548,666, dated Mar. 2, 2021, 11 pages.

Non-Final Office Action, U.S. Appl. No. 16/548,666, Mar. 2, 2021, 28 pages.

Notice of Allowance, U.S. Appl. No. 16/548,699, dated Jul. 27, 2020, 9 pages.

\* cited by examiner

US 11,237,612 B2

CHARGE-SHARING CAPACITIVE MONITORING CIRCUIT IN A MULTI-CHIP PACKAGE TO CONTROL POWER

TECHNICAL FIELD

The present disclosure generally relates to die power management, and more specifically, relates to power management of a multiple-chip package.

BACKGROUND ART

A memory sub-system can include one or more memory components that store data. The memory components can be, for example, non-volatile memory components and volatile memory components. In general, a host system can utilize a memory subsystem to store data at the memory components and to retrieve data from the memory components.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

DETAILED DESCRIPTION

Figure 1:
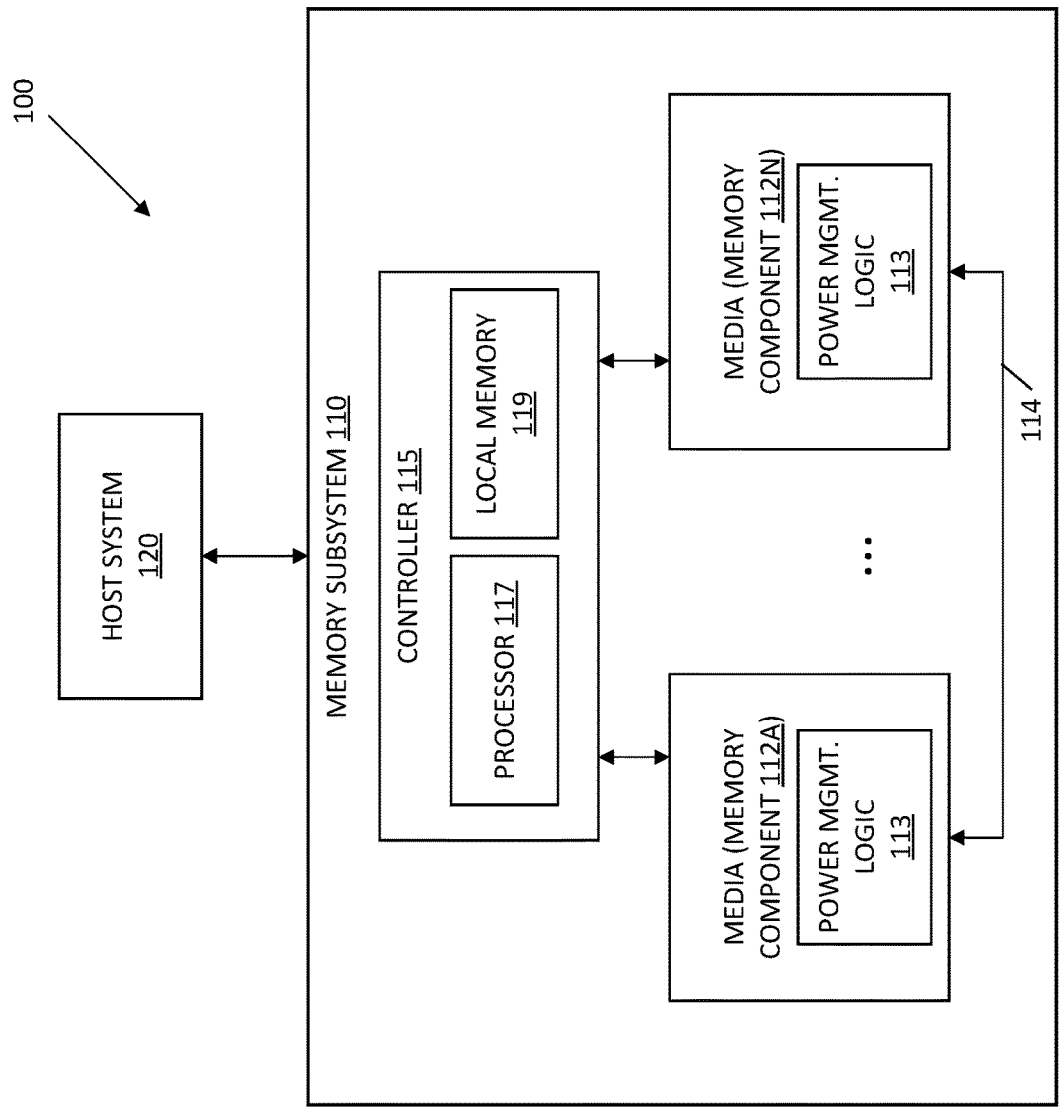
FIG. 1 illustrates an example computing environment that includes a memory subsystem in accordance with some embodiments of the present disclosure.

Aspects of the present disclosure are directed to manage usage of power in a package having multiple chips or dice for a memory subsystem. An example of a memory subsystem is a memory module that is connected to a central processing unit (CPU) via a memory bus. A memory sub-system can be a storage device, a memory module, or a hybrid of a storage device and memory module. Examples of storage devices and memory modules are described below in conjunction with FIG. 1. In general, a host system can utilize a memory subsystem that includes one or more memory devices. The memory devices can include, for example, non-volatile memory devices (e.g., NAND). Other types of memory devices, including volatile memory devices, are described in greater detail below in conjunction with FIG. 1. The host system can provide data to be stored at the memory subsystem and can request data to be retrieved from the memory subsystem.

In one embodiment, multiple dice or chips (collectively referred to as "dice") that are part of a power network implement the memory components. In one embodiment, the multiple dice reside in a single semiconductor or similar package, such as a System in Package or another three-dimensional integrated circuit package. For example, the package can contain stacked memory dice. The power network then provides the power to the package and cumulative power consumption is across the multiple dice. Because some operations, such as programming, erasing, and reading a memory component, are relatively high current operations, not all the dice within the package can perform them at the same time. Typically, the power system has a total power consumption limit (referred to as peak power) for the package and the operations by the dice in the package cannot cumulatively exceed this limit. As such, too many dice executing high current operations concurrently can result in power consumption exceeding the peak power consumption limit. A system can maintain a power consumption limit in the power network by limiting the number of dice performing the high current operations. One approach is to limit the number of active dice that can perform high current operations at any given time, based on the peak power consumption rating for the respective die. However, this approach has a disadvantage in that, during any given period for those dice selected to be active, the total actual power consumption for those active dice may not reach or approach the peak power limit. For example, the limit of concurrent high current operations can be based upon a worst-case scenario in which all dice are active. In those instances, in which less than all dice are active, or some operate with minimal power consumption, the power network has excess power capacity available but inefficiently blocks the higher current operations of other dice.

Aspects of the present disclosure address the above and other deficiencies by the dice within a package each providing an indication of their respective power consumption usage onto a shared common node (e.g., line, pin or terminal). The common node aggregates or accumulates the power consumption usage values to provide a total power consumption value for the package. Each die can then monitor the common node and determine if a higher current operation, if performed, would exceed the peak power consumption limit. If so, then a die can refrain from performing the higher current operation. If the operation does not exceed the peak power consumption limit, then that die can perform the operation. Each die can have predefined peak power consumption configured in the die or a controller can provide power consumption information to the memory component(s), (e.g., through a set command sequence). In this manner, each die stores or otherwise has access to the target system's specific power limit. The die indicates the higher power usage on the common node, so that others monitoring the common node are aware of the added usage. The below description provides for a number of different approaches or embodiments to aggregate individual power usage onto the common node and individual dice monitoring the common node to schedule their individual higher current operations without exceeding the total power consumption limit or some other threshold. In this manner, all dice can efficiently use the power network to perform operations. The examples below refer to "die" and "dice," but the use of "die" and "dice" are interchangeable with "chip" and "chips."

FIG. 1 illustrates an example computing environment 100 that includes a memory subsystem 110 in accordance with some embodiments of the present disclosure. The memory subsystem 110 can include media, such as memory components 112A to 112N (also referred to as "memory devices"). The memory components 112A to 112N can be volatile memory components, non-volatile memory components, or a combination of such. A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, and a hard disk drive (HDD). Examples of memory modules include a dual in-line memory module (DIMM), a small outline DIMM (SO-DIMM), and a non-volatile dual in-line memory module (NVDIMM).

The computing environment 100 can include a host system 120 that is coupled to one or more memory subsystems 110. In some embodiments, the host system 120 is coupled to different types of memory sub-system 110. FIG. 1 illustrates one example of a host system 120 coupled to one memory sub-system 110. The host system 120 uses the memory sub-system 110, for example, to write data to the memory sub-system 110 and read data from the memory sub-system 110. As used herein, "coupled to" generally refers to a connection between components, which can be an indirect communicative connection or direct communicative connection (e.g., without intervening components), whether wired or wireless, including connections such as electrical, optical, magnetic, etc.

The host system 120 can be a computing device such as a desktop computer, laptop computer, network server, mobile device, embedded computer (e.g., one included in a vehicle, industrial equipment, or a networked commercial device), or such computing device that includes a memory and a processing device. The host system 120 can include or be coupled to the memory subsystem 110 so that the host system 120 can read data from or write data to the memory subsystem 110. The host system 120 can be coupled to the memory subsystem 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), etc. The physical host interface can be used to transmit data between the host system 120 and the memory subsystem 110. The host system 120 can further utilize an NVM Express (NVMe) interface to access the memory components 112A to 112N when the memory subsystem 110 is coupled with the host system 120 by the PCIe interface. The physical host interface can provide an interface for passing control, address, data, and other signals between the memory subsystem 110 and the host system 120.

The memory components 112A to 112N can include any combination of the different types of non-volatile memory components and/or volatile memory components. An example of non-volatile memory components includes a negative-and (NAND) type flash memory. Each of the memory components 112A to 112N can include one or more arrays of memory cells such as single level cells (SLCs), multi-level cells (MLCs), triple-level cells (TLCs), or quad-level cells (QLCs). In some embodiments, a particular memory component can include both a low bit density portion (e.g., an SLC portion) and a high bit density portion (e.g., an MLC portion) of memory cells. Each of the memory cells can store one or more bits of data (e.g., data blocks) used by the host system 120. Although non-volatile memory components such as NAND type flash memory are described, the memory components 112A to 112N can be based on any other type of memory such as a volatile memory. In some embodiments, the memory components 112A to 112N can be, but are not limited to, random access memory (RAM), read-only memory (ROM), dynamic random access memory (DRAM), synchronous dynamic random access memory (SDRAM), phase change memory (PCM), magneto random access memory (MRAM), negative-or (NOR) flash memory, electrically erasable programmable read-only memory (EEPROM), and a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. Furthermore, the memory cells of the memory components 112A to 112N can be grouped as memory pages or data blocks that can refer to a unit of the memory component used to store data.

The memory system controller 115 (hereinafter referred to as "controller") can communicate with the memory components 112A to 112N to perform operations such as reading data, writing data, or erasing data at the memory components 112A to 112N and other such operations. The controller 115 can include hardware such as one or more integrated circuits and/or discrete components, a buffer memory, or a combination thereof. The controller 115 can be a microcontroller, special purpose logic circuitry (e.g., a field programmable gate array (FPGA), an application specific integrated circuit (ASIC), etc.), or another suitable processor. The controller 115 can include a processor (processing device) 117 configured to execute instructions stored in local memory 119. In the illustrated example, the local memory 119 of the controller 115 includes an embedded memory configured to store instructions for performing various processes, operations, logic flows, and routines that control operation of the memory subsystem 110, including handling communications between the memory subsystem 110 and the host system 120. In some embodiments, the local memory 119 can include memory registers storing memory pointers, fetched data, etc. The local memory 119 can also include read-only memory (ROM) for storing micro-code. While the example memory subsystem 110 in FIG. 1 has been illustrated as including the controller 115, in another embodiment of the present disclosure, a memory subsystem 110 may not include a controller 115, and may instead rely upon external control (e.g., provided by an external host, or by a processor or controller separate from the memory subsystem).

In general, the controller 115 can receive commands or operations from the host system 120 and can convert the commands or operations into instructions or appropriate commands to achieve the desired access to the memory components 112A to 112N. The controller 115 can be responsible for other operations such as wear leveling operations, garbage collection operations, error detection and error-correcting code (ECC) operations, encryption operations, caching operations, and address translations between a logical block address and a physical block address that are associated with the memory components 112A to 112N. The controller 115 can further include host interface circuitry to communicate with the host system 120 via the physical host interface. The host interface circuitry can convert the commands received from the host system into command instructions to access the memory components 112A to 112N as well as convert responses associated with the memory components 112A to 112N into information for the host system 120.

The memory subsystem 110 can also include additional circuitry or components that are not illustrated. In some embodiments, the memory subsystem 110 can include a cache or buffer (e.g., DRAM) and address circuitry (e.g., a row decoder and a column decoder) that can receive an address from the controller 115 and decode the address to access the memory components 112A to 112N. In one embodiment, each memory component 112 includes a processor (or similar circuitry) and local memory. In one embodiment, each memory component 112 represents memory components constructed on a single die (or chip). The description below, pertaining to the subsequent Figures, references die 112 or dice 112. Such designation of "112" corresponds to one or more of the memory components 112A-112N in some embodiments. Thus, "die 112" and "dice 112" refer to one or more of the memory components 112A-112N in the description below. In one embodiment, memory components 112A to 112N reside within a same housing or package, such as by stacking the dice (or chips).

The memory subsystem 110 includes power management logic (PML) (also referred to as a power manager) 113 in each die 112 that can manage power consumption within the respective die 112. The dice 112A to 112N can reside in a single package and can operate by deriving power from a power network. The PML 113 of each die 112 connects to a common node 114 (e.g., line, pin, terminal, etc.) to transmit an indication of its die's power consumption, in which aggregation or accumulation of the individual indications from the dice occurs at the common node to provide an indication of total power consumption of all of the dice 112. Each PML 113 also monitors the common node 114 to determine the current state or value of total power consumption for the dice 112. Each PML 113 then can use the monitored indication to determine if its die's planned memory operation will exceed or not exceed the total power consumption, or some threshold level. Each die can have predefined total power consumption or peak power consumption information configured in the die. Alternatively, the controller 115 can provide the power consumption information to the memory component(s) 112A-112N, (e.g., through a set command sequence), so that each die stores or otherwise has access to the target system's specific power limit after the host system 120 communicates with the memory subsystem 110. The controller can pass this information to the memory component(s) 112A-112N. The description below provides further details with regard to different embodiments for the operation of the PML 113 and configurations of the common node 114.

Figure 2:
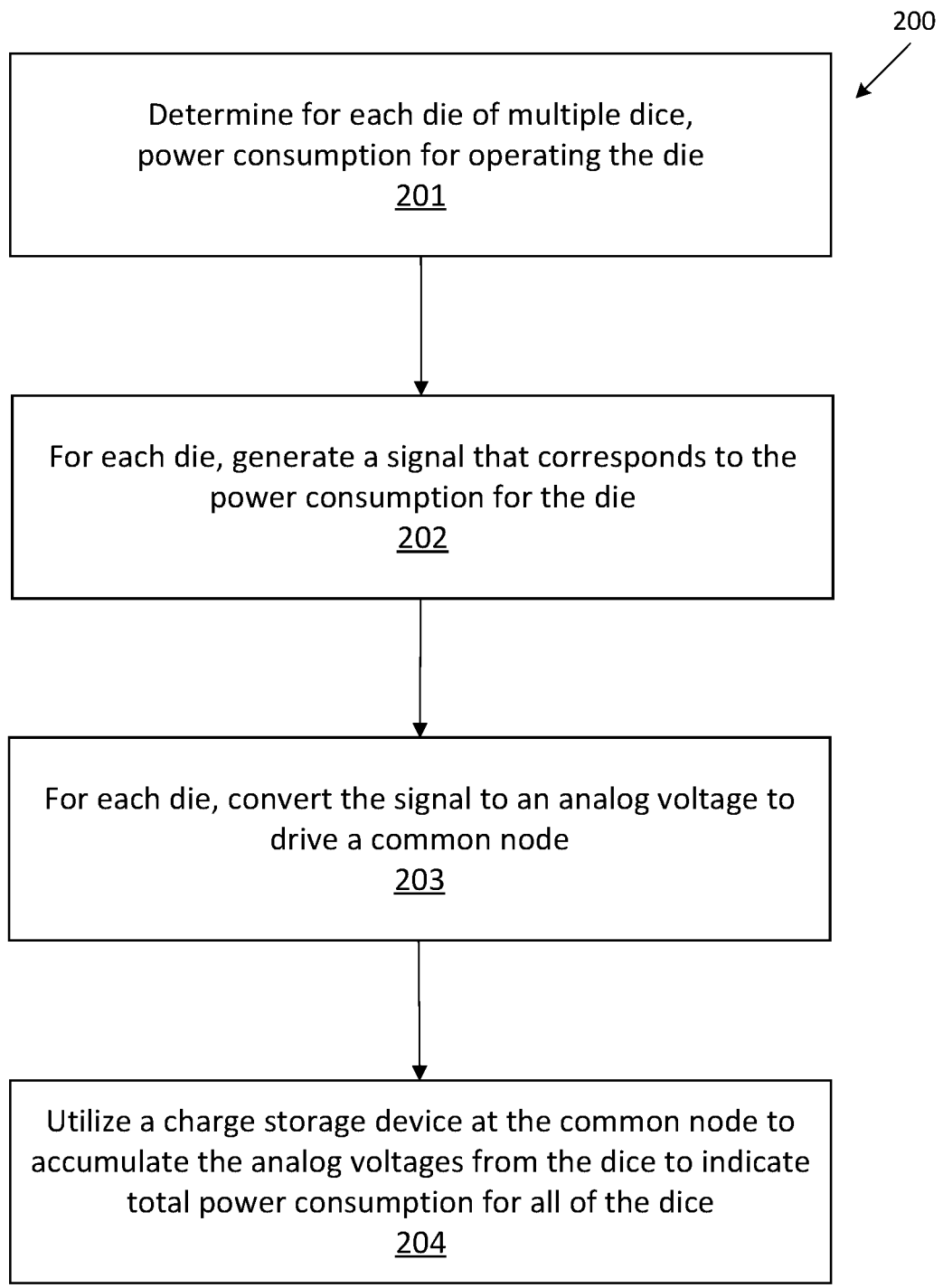
FIG. 2 is a flow diagram of an example method to manage power consumption for multiple dice in a package, operating from a power network, and utilizing a charge storage device at a common node, in accordance with some embodiments of the present disclosure.

FIG. 2 is a flow diagram of an example method 200 to manage power consumption for multiple dice in a package, operating from a power network, and utilizing a charge storage device at a common node, in accordance with some embodiments of the present disclosure. The method 200 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the PML 113 of FIG. 1 performs the method 200 (the PML 113 and other processing logic collectively referred to as "processing device" below). In some embodiments, the circuitry of FIG. 4 performs the method 200. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 201, the processing device (e.g., the PML 113) of each die 112 determines an amount of power consumption for operating its respective die. The power consumption for the die 112 is dependent on the activity of the die 112. When in a higher current state, such as for performing a memory operation, the power consumption is higher than when in a non-activity state. The processing device can use a variety of techniques to determine the power consumption for its die 112. For example, the processing device determines the power consumption for the next operation (if any) for the die 112 to perform. In one embodiment, the processing device uses a lookup table or other data structure to map an operation with a digital or analog value corresponding to the operation. In one technique, current measurement, e.g., supply current, provides an indication of the die's power consumption.

At operation 202, each processing device generates a signal that corresponds to the power consumption for its die 112. For example, the processing device can generate one of a variety of signals corresponding to power consumption, including voltage or current, analog or digital. In one embodiment, the processing device generates the signal using a digital-to-analog converter to convert a digital value to an analog value to indicate power consumption. In one embodiment, the signal is a current signal. In one embodiment, the current signal can be the supply current (or a fraction of the supply current) drawn by the die 112 to indicate the power consumption. The amount of the supply current drawn by the die 112 corresponds to the determined power consumption.

At operation 203, each processing device converts the signal to an analog signal to drive the common node 114. The conversion performed depends on the type of the signal used to indicate the die's power consumption. For the embodiment that employs a current signal, the conversion is to a voltage. Thus, the value of the current converts to voltage when driven onto the common node 114. In one embodiment a transimpedance amplifier performs the current-to-voltage conversion for driving the common node 114. Thus, the analog voltage generated corresponds to an indication of that die's power consumption value. With each processing device generating its respective die's power consumption, the resultant voltage driven onto the common node by all of the dice 112 corresponds to a value indicative of the total power consumption by the dice in the package.

At operation 204, a charge storage device, such as a capacitor, accumulates the charge driven onto common node 114 by each die 112. Therefore, the resulting voltage on the capacitor is an indication of the power consumption by all of the dice 112 in the package.

Figure 3:
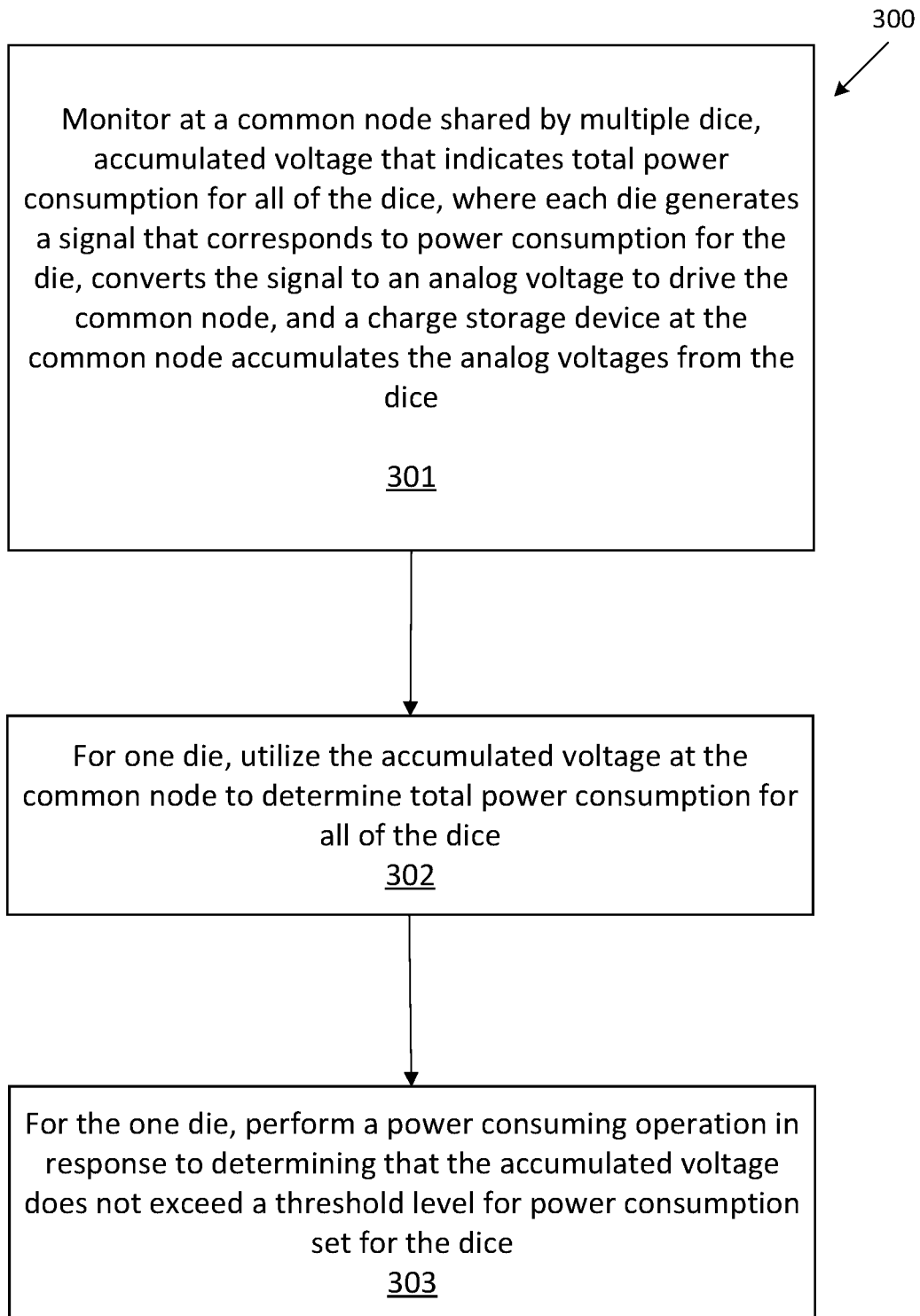
FIG. 3 is a flow diagram of an example method to manage power consumption for one die of multiple dice, by monitoring a common node that utilizes a charge storage device to determine the total power consumption for the multiple dice, in order to perform a power consuming operation, in accordance with some embodiments of the present disclosure.

FIG. 3 is a flow diagram of an example method 300 to manage power consumption for one die of multiple dice, by monitoring a common node that utilizes a charge storage device to determine the total power consumption for the multiple dice, in order to perform a power consuming operation, in accordance with some embodiments of the present disclosure. The method 300 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the PML 113 of FIG. 1 performs the method 300. In some embodiments, the circuitry of FIG. 4 performs the method 300. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 301, each processing device (e.g., PML 113) of the dice 112 contained in the package monitors the common node 114 shared by the dice. For example, each processing device monitors the accumulated voltage on the common node 114 that indicates total power consumption for all of the dice 112 in the package. In some embodiments, the method 200 of FIG. 2 provides the technique for driving an analog voltage on to the common node 114 to charge a storage device, such as a capacitor. As described above, the charge storage device accumulates the charges at the common node.

At operation 302, the processing device of one die utilizes the accumulated voltage of the common node 114 to determine the indicated total power consumption for the dice 112 of the package. In one embodiment, the processing device converts the analog voltage of the common node 114 to a digital value by use of an analog-to-digital converter.

At operation 303, the processing device determines if an operation that the die 112 is about to perform will exceed a threshold value for power consumption. In some embodiments, the threshold level is the peak power level set for all of the dice 112 of the package operating on the power network. Because the die 112 has indicated its current power consumption (e.g., the method 200) onto the common node 114, along with indications of other dice, the processing device knows the total power consumption for the package. The processing device can determine if the required power for the intended operation, when considered with the aggregated value on the common node 114, will exceed the threshold. In one embodiment, the processing device uses a lookup table or other data structure to map an operation with a digital or analog value corresponding to the operation. If the potential increase in the power consumption can result in the total power exceeding the threshold value for the package, the die 112 does not perform the operation, delays performing the operation, or performs a lower-power version of the operation. If the potential increase in the power consumption cannot, or most likely will not, exceed the threshold value for the package, the die 112 performs the operation. When performing the operation, the processing device of the die 112 updates the die's power consumption indication onto the common node 114 to reflect the new power consumption value for the die in performing the operation. In some embodiments, the processing device of the die 112 updates the die's power consumption indication onto the common node 114 prior to performing the operation, in order to advertise or reserve power for the operation to prevent another die from executing another power consuming operation.

Figure 4:
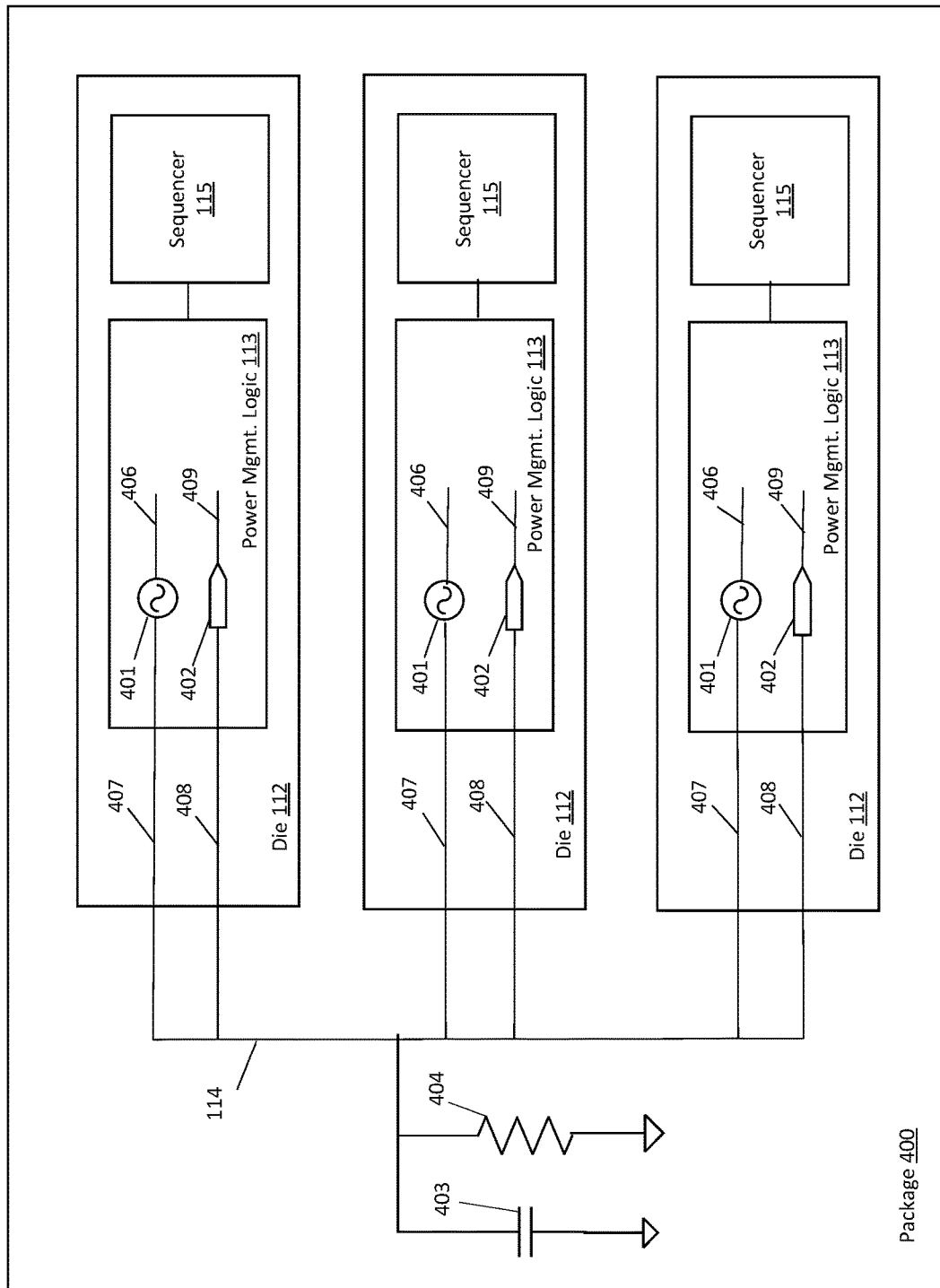
FIG. 4 is a block diagram of an example package that contains multiple dice, each die having a power management logic to perform the methods of FIG. 2 and/or FIG. 3, in accordance with some embodiments of the present disclosure.

FIG. 4 is a block diagram of an example package 400 that contains multiple dice, each die having a PML to perform the methods of FIG. 2 and/or FIG. 3. The package 400 shows only three dice, however, the actual number present can vary depending on the design. Each die 112 includes a sequencer 115, along with the PML 113. Each sequencer 115 is responsible for sequencing the various memory operations performed within its respective die 112. Such operations include the scheduling and performing of read, program, and erase operations related to memory cells. The PML 113 manages the power-related operations for the die 112. In some embodiments, the PML 113 and sequencer 115 are separate components. In some embodiments, the PML 113 and sequencer 115 are a combined component. In some embodiments, the sequencers 115 of the dice 112 can communicate with one another. Each PML 113 couples to the common node 114.

In operation, the PML 113 of each die 112 determines an amount of power consumption for operating its respective die. In some embodiments, the sequencer 115 can provide information to make the determination about power consumption. The power consumption for the die 112 is dependent on the activity of the die. When in a higher current state, such as for performing a program, read, or erase operation, the power consumption is higher than when in a non-activity state. The PML 113 can use a variety of techniques to determine the power consumption for its die 112. In one technique, an amount of current (e.g., supply current) drawn by the die can provide an indication of die's power consumption.

Each PML 113 generates a signal on line 406 that corresponds to the power consumption for its die 112. The PML 113 can generate one of a variety of signals corresponding to power consumption, including voltage or current and analog or digital. In one embodiment, the PML 113 generates the signal on line 406 using a digital-to-analog converter to convert a digital value to an analog value. In one embodiment, the signal on line 406 is a current signal. In one embodiment, the current signal can be the supply current (or a fraction of the supply current) drawn by the die 112 to indicate the power consumption. The amount of the current drawn by the die 112 corresponds to the power consumption of the die 112. In some embodiments, the sequencer 115 can provide the signal of line 406 to the PML 113.

Each PML 113 converts the signal on line 406 to an analog signal on line 407 to drive the common node 114. The conversion performed depends on the type of the signal used to indicate the die's power consumption. For the embodiment that employs a current signal, the conversion is from current to a voltage. Thus, the value of the current converts to voltage when driven on to the common node 114. In the shown embodiment a transimpedance amplifier 401 performs the current-to-voltage conversion for driving the common node 114. The analog voltage generated on line 407 corresponds to an indication of the die's power consumption value. With each PML 113 generating its respective die's power consumption, the resultant voltage driven onto the common node 114 by all of the dice 112 corresponds to a value indicative of the total power consumption by the dice in the package 400.

The package 400 includes a charge storage device, shown as a capacitor 403, to accumulate the charge driven onto common node 114. The resulting voltage on the capacitor 403 provides an indication of the power consumption by all of the dice 112 in the package 400. A leakage resistor 404 in parallel with the capacitor 403 provides a discharge path for the capacitor. Although the package includes both circuit components 403 and 404, one or both components 403, 404 can reside outside of the package. In some embodiments, a designated pin or terminal on each die 112 connects line 407 to the common node 114.

To manage power consumption for each die 112, each PML 113 monitors the accumulated voltage on the common node 114. In some embodiments, a designated pin or terminal on each die connects line 408 to the common node 114 to monitor the voltage on the common node 114. A PML 113 of one die utilizes the accumulated voltage of the common node 114 to determine the indicated total power consumption for the dice 112 of the package 400. In one embodiment, the PML 113 converts the analog voltage on line 408 to a digital value by use of an analog-to-digital converter 402 and outputs the digital signal on line 409. The PML 113 can pass this information on line 409 to the sequencer 115.

The PML 113 determines if the next operation that the die 112 is about to perform will exceed a threshold value for power consumption. In some embodiments, the threshold level is the peak power level set for all of the dice 112 of the package 400 operating on the power network. Because the die 112 has indicated its current power consumption onto the common node 114, along with indications of other dice, the PML 113 knows the total power consumption for the package. The PML 113 can determine if the required power for the next operation, when considered with the aggregated value on the common node 114, will exceed the threshold. If the potential increase in the power consumption can result in the total power exceeding the threshold value, the die 112 does not perform the operation, delays performing the operation, or performs a lower-power version of the operation. If the potential increase in the power consumption cannot, or most likely will not, exceed the threshold value, the die 112 performs the operation. When performing the operation, the PML 113 of the die 112 updates the die's power consumption indication on the common node 114 to reflect the new power consumption value for the die in performing the operation. In some embodiments, the PML 113 of the die 112 updates the die's power consumption indication onto the common node 114 prior to performing the operation, in order to advertise or reserve power for the operation to prevent another die from executing another power consuming operation. In some embodiments, the sequencer 115 can perform some or all of the operational functions, or aid in the performance of the operational functions of the die 112.

The circuitry of FIG. 4 allows for analog control over the power management of the dice 112 in the package 400. Analog voltage and/or current monitoring at the common node 114 allows each die 112 to determine the current power consumption of the package 400, so that each individual die can decide on which memory operation(s) it can currently perform, based on the monitored total power consumption value. When a die 112 cannot acquire adequate power to perform an operation, in some embodiments, the die 112 can delay performing the operation until power is available or perform a lower-power version of the operation. Furthermore, the circuitry of FIG. 4 can contain compensation devices/circuits/logic to adjust for process, temperature and/or voltage (PVT) fluctuations. PVT compensation allows for accurate performance of the PML 113 over fluctuating PVT conditions.

Figure 5:
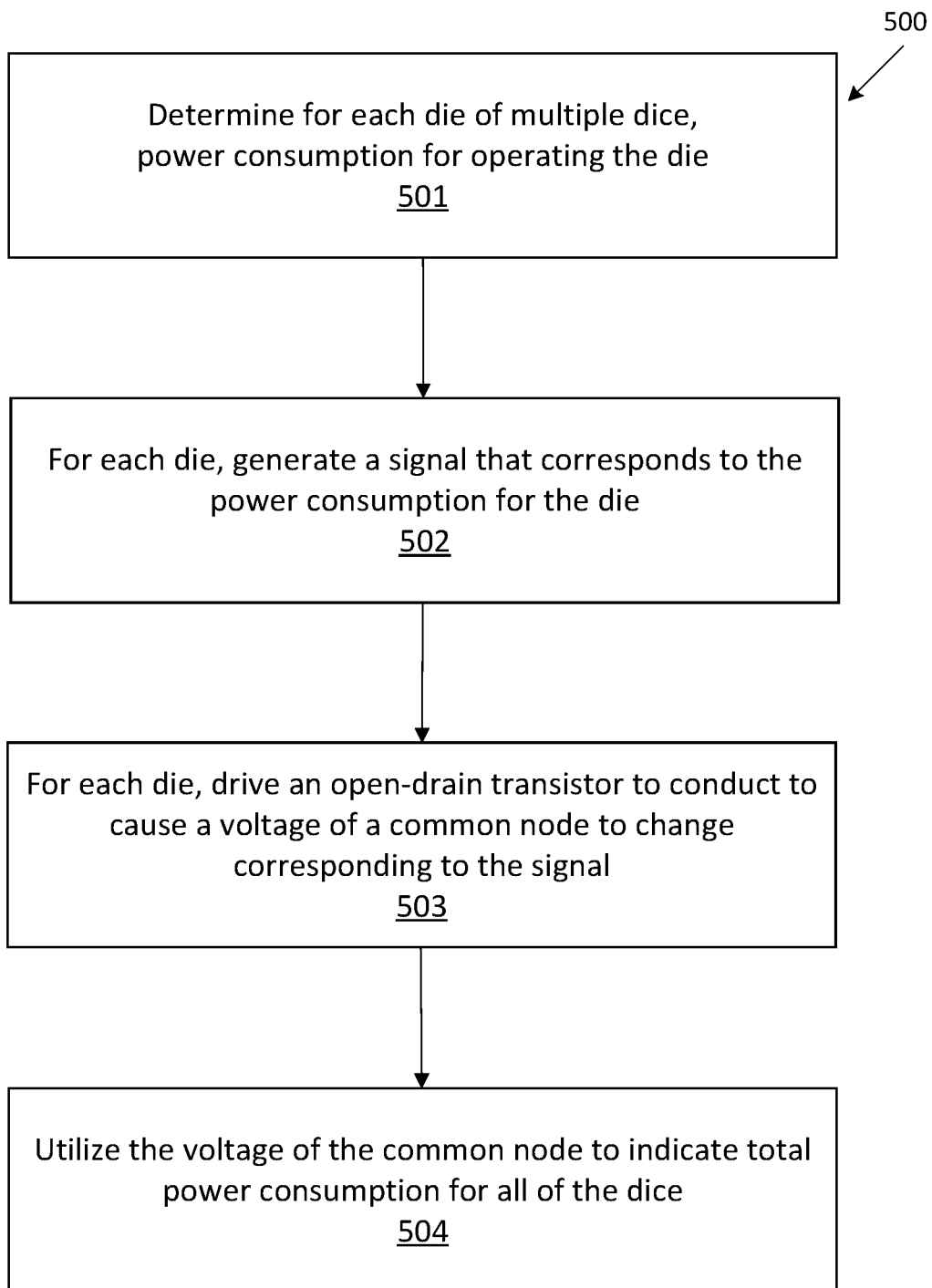
FIG. 5 is a flow diagram of an example method to manage power consumption for multiple dice in a package, operating from a power network, and utilizing open-drain transistors connected to a common node, in accordance with some embodiments of the present disclosure.

FIG. 5 is a flow diagram of an example method 500 to manage power consumption for multiple dice in a package and operating from a power network and utilizing open-drain transistors connected to a common node, in accordance with some embodiments of the present disclosure. The method 500 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the PML 113 of FIG. 1 performs the method 500 (the PML 113 and other processing logic collectively referred to as "processing device" below). In some embodiments, the circuitry of FIG. 7 performs the method 500. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 501, the processing device (e.g., the PML 113) of each die 112 determines an amount of power consumption for operating its respective die. The power consumption for the die 112 is dependent on the activity of the die 112. When in a higher current state, such as for performing a memory operation, the power consumption is higher than when in a non-activity state. The processing device can use a variety of techniques to determine the power consumption for its die 112. For example, the processing device determines the power consumption for the next operation (if any) for the die 112 to perform. In one embodiment, the processing device uses a lookup table or other data structure to map an operation with a digital or analog value corresponding to the operation. In one technique, current measurement, e.g., supply current, provides an indication of the die's power consumption.

At operation 502, each processing device generates a signal that corresponds to the power consumption for its die 112. For example, the processing device can generate one of a variety of signals corresponding to power consumption, including voltage or current and analog or digital. In one embodiment, the processing device generates the signal using a digital-to-analog converter to convert a digital value to an analog value. In one embodiment, the signal is an analog voltage signal, which voltage value corresponds to the current drawn by that die. The amount of the supply current drawn by the die 112 corresponds to the determined power consumption.

At operation 503, each processing device uses the analog voltage to drive a gate of an open-drain transistor, so that the drain voltage corresponds to the gate drive voltage. The drain connection is to the common node 114, so that the transistor drives the voltage variation onto the common node 114. In one embodiment, the drains of the transistors of each die 112 connect to the common node 114 and the common node 114 connects to a reference voltage, such as a supply voltage. When the transistors are in the off state, the common node 114 is at the reference voltage. However, when the transistor(s) conduct, the voltage of the common node 114 drops from the reference voltage, in which the amount of the voltage drop corresponds to the amount of the conduction of the transistor(s). Because the amount of the transistor conduction depends on the gate signal to the transistor, each processing device causes a voltage change (e.g., voltage drop) from the reference value, which change corresponds to that die's power consumption.

At operation 504, with each processing device driving the voltage change onto the common node 114 when conducting, the voltage at the common node 114 represents the cumulative drive from all the dice 112. Thus, the voltage at the common node 114 has a voltage variance from the reference value that corresponds as an indication of the total power consumption by the dice 112 in the package.

Figure 6:
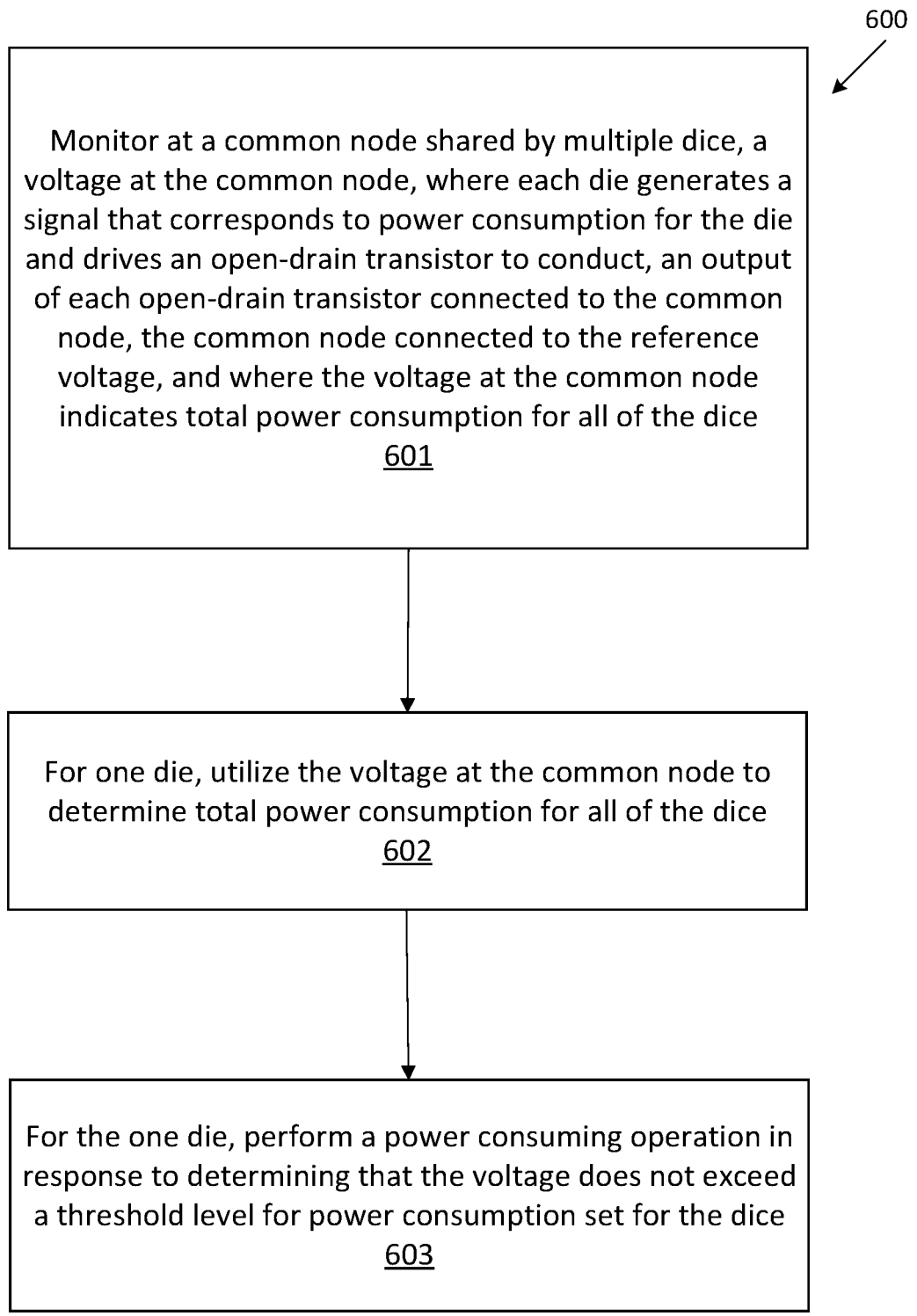
FIG. 6 is a flow diagram of an example method to manage power consumption for one die of multiple dice, by monitoring a common node having open-drain transistors to determine the total power consumption for the multiple dice, in order to perform a power consuming operation, in accordance with some embodiments of the present disclosure.

FIG. 6 is a flow diagram of an example method 600 to manage power consumption for one die of multiple dice, by monitoring a common node having open-drain transistors to determine the total power consumption for the multiple dice, in order to perform a power consuming operation, in accordance with some embodiments of the present disclosure. The method 600 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the PML 113 of FIG. 1 performs the method 300. In some embodiments, the circuitry of FIG. 7 performs the method 600. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 601, each processing device (e.g., the PML 113) of the dice 112 contained in the package monitors the common node 114 shared by the dice. For example, each processing device monitors the voltage on the common node 114 that indicates total power consumption for all of the dice 112 in the package. In some embodiments, the method 500 of FIG. 5 provides the technique for using an open-drain transistor to cause a voltage of the common node 114 to change corresponding to the conduction of the transistor. Each processing device utilizes an open-drain transistor configuration and when driven into conduction, causes a voltage of the common node 114 to change in response to the conduction. As described above, all voltage changes combined at the common node 114 corresponds to the total power consumption.

At operation 602, the processing device of one die 112 utilizes the voltage of the common node 114 to determine the indicated total power consumption for the dice of the package. In one embodiment, the processing device converts the analog voltage of the common node 114 to a digital value by use of an analog-to-digital converter. Other embodiments can use other techniques.

At operation 603, the processing device determines if the next operation that the die 112 is about to perform will exceed a threshold value for power consumption. In some embodiments, the threshold level is the peak power level set for all of the dice 112 of the package operating on the power network. Because the die 112 has indicated its current power consumption (e.g., the method 500) onto the common node 114, along with indications of other dice, the processing device knows the total power consumption for the package. The processing device can determine if the required power for the intended operation, when considered with the aggregated value on the common node 114, will exceed the threshold. In one embodiment, the processing device uses a lookup table or other data structure to map an operation with a digital or analog value corresponding to the operation. If the potential increase in the power consumption can result in the total power exceeding the threshold value, the die 112 does not perform the operation, delays performing the operation, or performs a lower-power version of the operation. If the potential increase in the power consumption cannot, or most likely will not, exceed the threshold value, the die 112 performs the operation. When performing the operation, the processing device of the die 112 updates the die's power consumption indication on the common node 114 to reflect the new power consumption value for the die in performing the operation. In some embodiments, the processing device of the die 112 updates the die's power consumption indication onto the common node 114 prior to performing the operation, in order to advertise or reserve power for the operation to prevent another die from executing another power consuming operation.

Figure 7:
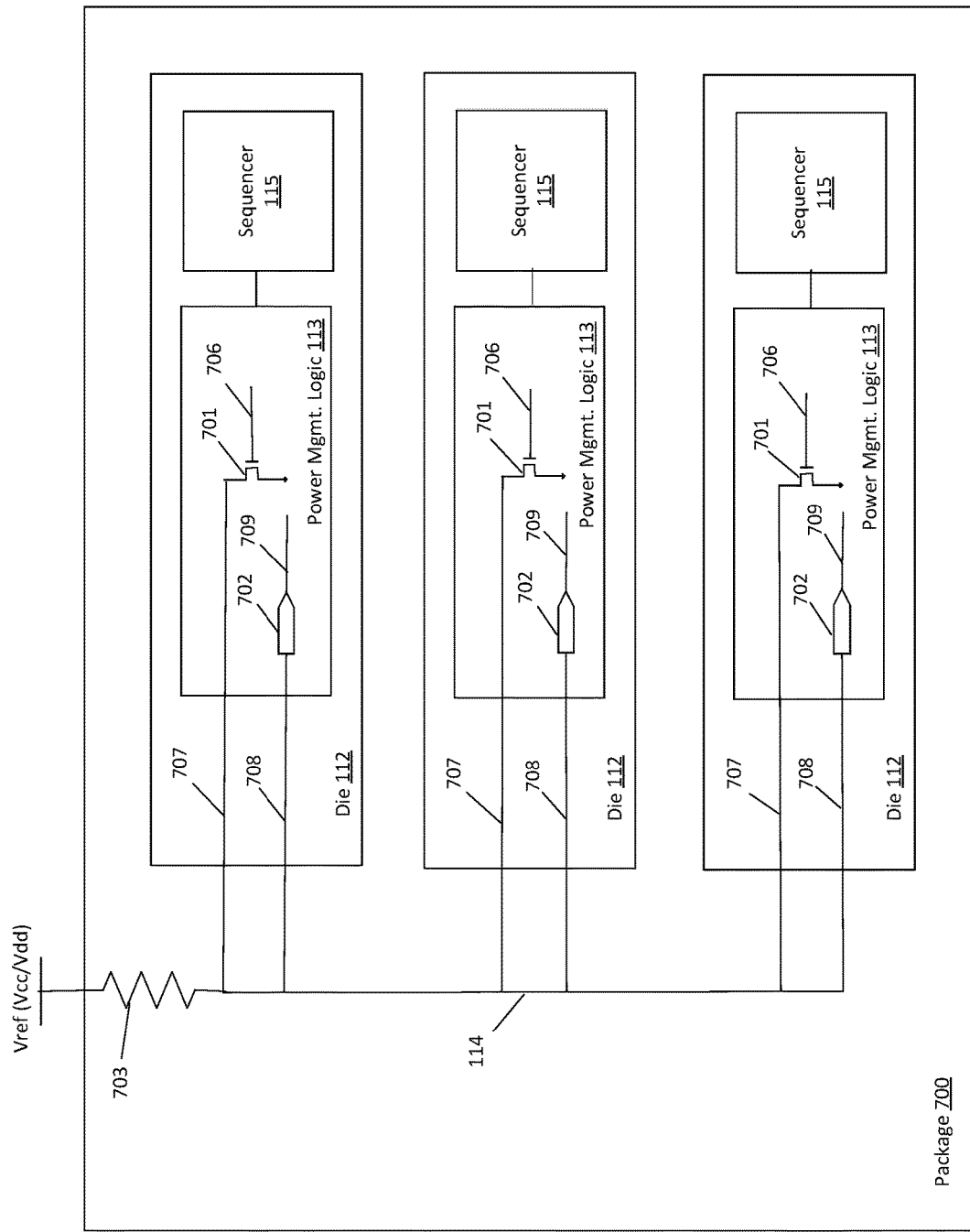
FIG. 7 is a block diagram of an example package that contains multiple dice, each die having a power management logic to perform the methods of FIG. 5 and/or FIG. 6, in accordance with some embodiments of the present disclosure.

FIG. 7 is a block diagram of an example package 700 that contains multiple dice, each die having a PML to perform the methods of FIG. 5 and/or FIG. 6. The package 700 shows only three dice 112, however, the actual number present can vary depending on the design. Each die 112 includes a sequencer 115, along with the PML 113. Each sequencer 115 is responsible for sequencing the various memory operations performed within its respective die 112. Such operations include the scheduling and performing of read, program, and erase operations related to memory cells. The PML 113 manages the power related operations for the die 112. In some embodiments, the PML 113 and sequencer 115 are separate components. In some embodiments, the PML 113 and sequencer 115 are a combined component. In some embodiments, the sequencers 115 of the dice 112 can communicate with one another. Each PML 113 couples to the common node 114.

In operation, the PML 113 of each die 112 determines an amount of power consumption for operating its respective die. In some embodiments, the sequencer 115 can provide information to make the determination about power consumption. The power consumption for the die 112 is dependent on the activity of the die. When in a higher current state, such as for performing a program, read, or erase operation, the power consumption is higher than when in a non-activity state. The PML 113 can use a variety of techniques to determine the power consumption for its die 112. In one technique, current measurement (e.g., supply current) provides an indication of die's power consumption.

Each PML 113 generates a signal on line 706 that corresponds to the power consumption for its die. PML 113 can generate one of a variety of signals corresponding to power consumption, including voltage or current and analog or digital. In one embodiment, the signal is an analog voltage signal, which voltage value corresponds to the current drawn by that die.

Each PML 113 uses the analog voltage to drive a gate of an open-drain transistor 701. The transistors have the drain line 707 connected to the common node 114. In some embodiments, transistors 701 is a Complementary Metal-Oxide-Semiconductor (CMOS) transistor. The common node 114 connects to a reference voltage Vref via a pull-up resistor 703. In some embodiments, Vref can be a supply voltage (e.g., Vcc or Vdd) provided to the dice. When the transistors are in the off state, the drain line 707 is at the Vref level. The resistor 703 can reside inside the package 700 or outside of the package 700. When one or more transistors 701 conduct, the conducting transistors operate to pull current from the common node 114 and pull the voltage down from the Vref value. The amount of the pull-down is dependent on the value of the signal driving the gate of the transistor 701. The voltage of the common node 114 drops from the reference voltage Vref, in which the amount of the voltage drop corresponds to the amount of the conduction of the transistor(s) 701. Because the amount of the transistor conduction depends on the gate signal to the transistor, each PML 113 causes a voltage change (e.g., voltage drop) from the reference value, which change corresponds to that die's power consumption.

Each PML 113 drives the respective transistor 701 to cause a voltage pull-down of line 707. The amount of the cumulative pull-down by the transistors 701 of dice 112 translates to an amount of the voltage from Vref at the common node 114. Thus, this voltage variation from Vref at the common node 114 for all dice 112 corresponds to the total power consumption of the dice 112. In some embodiments, a controller or regulator can control the value of Vref, in order to vary the distance between Vref and a threshold level setting (such as for peak power). With a lower Vref, the common node 114 can reach the threshold voltage level with smaller number of active dice 112, which has the effect of lowering the power limit. With a higher Vref, the common node 114 can reach the threshold voltage level with higher number of active dice 112, which has the effect of raising the power limit. In this manner, a system can adjust the Vref based on the task load and system power requirement, in order to balance power limit and task execution time.

In some embodiments, each PML 113 uses multiple transistors instead of just one transistor. The signal to the gates of the multiple transistors determine which transistors are to conduct. The signal can be digital in this instance with some embodiments. The multiple transistors operate in saturation mode when conducting, so that the number of transistors turned on to pull down the common node 114 determines the current from Vref and the resultant amount of the voltage change at the common node 114. In this instance, the plurality of transistors provides discrete step changes of the drain current on line 707.

To manage power consumption for each die 112, each PML 113 monitors the voltage on the common node 114 that indicates total power consumption for all of the dice 112 in the package 700. Higher the voltage difference between the common node voltage and Vref, higher the total power consumption. In some embodiments, a designated pin or terminal on each die 112 connects line 708 to the common node 114 to monitor the common node voltage. A PML 113 of one die 112 utilizes the voltage of the common node 114 to determine the indicated total power consumption for the dice of the package. In one embodiment, the PML 113 converts the analog voltage of the common node 114 to a digital value by use of an analog-to-digital converter 702 and outputs the digital signal on line 709. The PML 113 can pass this information on line 709 to the sequencer 115.

The PML 113 determines if the next operation the die 112 is about to perform will exceed a threshold value for power consumption. In some embodiments, the threshold level is the peak power level set for all of the dice 112 of the package operating on the power network. Because the die 112 has indicated its current power consumption onto the common node 114, along with indications of other dice, the PML 113 knows the total power consumption for the package. The PML 113 can determine if the required power for the next operation, when considered with the aggregated value on the common node 114, will exceed the threshold. If the potential increase in the power consumption can result in the total power exceeding the threshold value, the die 112 does not perform the operation, delays performing the operation, or performs a lower-power version of the operation. If the potential increase in the power consumption cannot, or most likely will not, exceed the threshold value, the die 112 performs the operation. When performing the operation, the PML 113 of the die 112 updates the die's power consumption indication on the common node 114 to reflect the new power consumption value for the die in performing the operation. In some embodiments, the PML 113 of the die 112 updates the die's power consumption indication onto the common node 114 prior to performing the operation, in order to advertise or reserve power for the operation to prevent another die from executing another power consuming operation. In some embodiments, the sequencer 115 can perform some or all of the operational functions, or aid in the performance of the operational functions of the die 112.

The circuitry of FIG. 7 allows for analog control over the power management of the dice 112 in the package 700. Analog voltage and/or current monitoring at a common node 114 allows each die 112 to determine the current power consumption of the package 700, so that each individual die decides on which memory operation(s) it can currently perform, based on the monitored total power consumption value. When a die 112 cannot acquire adequate power to perform an operation, in some embodiments, the die 112 can delay performing the operation until power is available or perform a lower-power version of the operation. Furthermore, the circuitry of FIG. 7 can contain compensation devices/circuits/logic to adjust for process, temperature and/or voltage (PVT) fluctuations. PVT compensation allows for accurate performance of the PML 113 over fluctuating PVT conditions.

Figure 8:
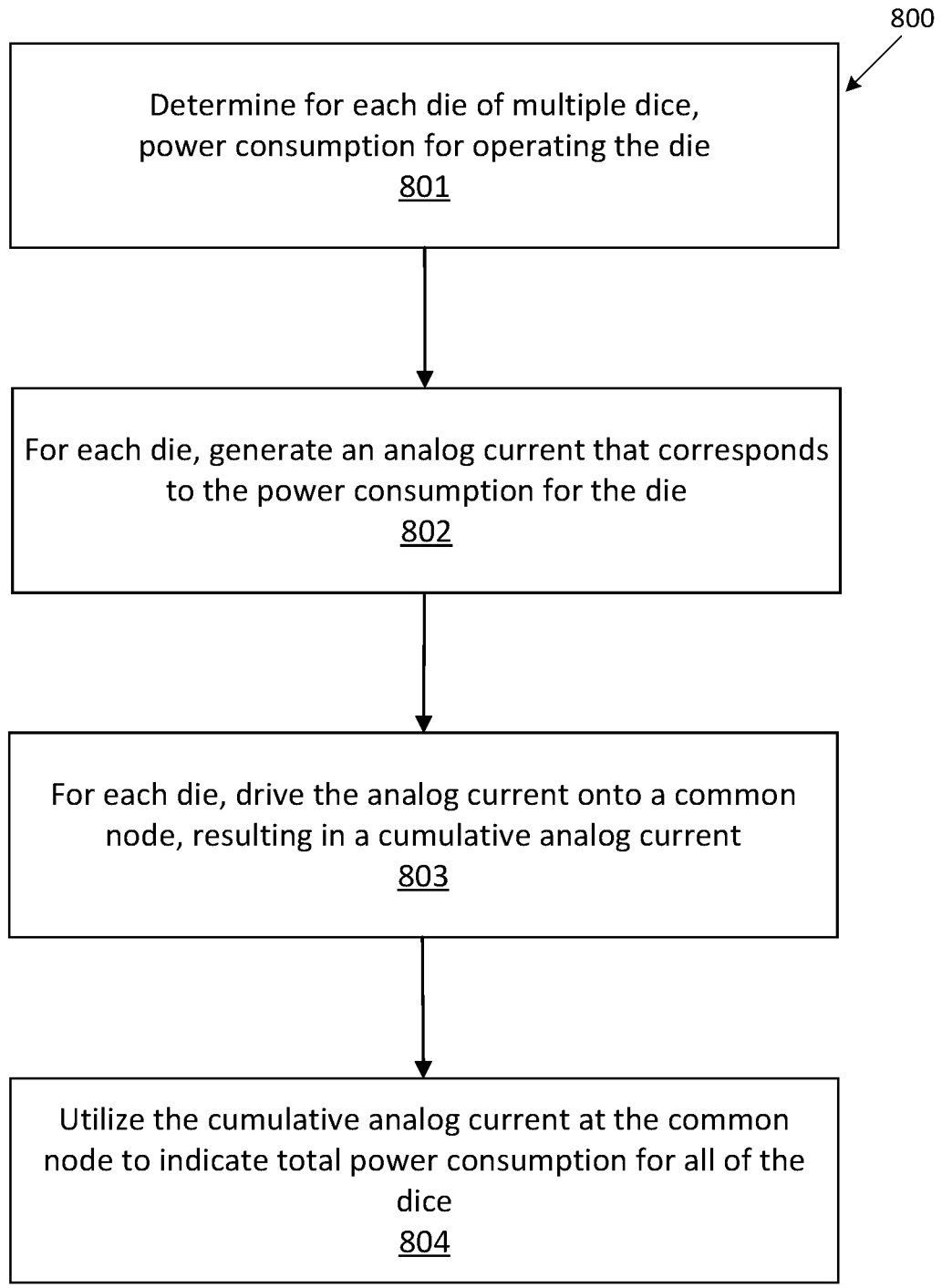
FIG. 8 is a flow diagram of an example method to manage power consumption for multiple dice in a package, operating from a power network, and utilizing current summation at a common node, in accordance with some embodiments of the present disclosure.

FIG. 8 is a flow diagram of an example method 800 to manage power consumption for multiple dice in a package, operating from a power network, and utilizing current summation at a common node, in accordance with some embodiments of the present disclosure. The method 800 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the PML 113 of FIG. 1 performs the method 800 (the PML 113 and other processing logic collectively referred to as "processing device" below). In some embodiments, the circuitry of FIG. 10 performs the method 800. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 801, the processing device (e.g., the PML 113) of each die 112 determines an amount of power consumption for operating its respective die. The power consumption for the die 112 is dependent on the activity of the die 112. When in a higher current state, such as for performing a memory operation, the power consumption is higher than when in a non-activity state. The processing device can use a variety of techniques to determine the power consumption for its die 112. For example, the processing device determines the power consumption for the next operation (if any) for the die 112 to perform. In one embodiment, the processing device uses a lookup table or other data structure to map an operation with a digital or analog value corresponding to the operation. In one technique, current measurement, e.g., supply current, provides an indication of die's power consumption.

At operation 802, each processing device generates a signal that corresponds to the power consumption for its die 112. For example, the processing device can generate one of a variety of signals corresponding to power consumption, including voltage or current and analog or digital. In one embodiment, the processing device generates the signal using a digital-to-analog converter to convert a digital value to an analog value to indicate power consumption. In one embodiment, the signal is a current signal. In one embodiment, the current signal can be the supply current (or a fraction of the supply current) drawn by the die to indicate the power consumption. The amount of the supply current drawn by the die 112 corresponds to the determined power consumption.

At operation 803, each processing device drives the analog signal to drive the common node 114. For the embodiment that employs a current signal, a current source drives an analog current onto the common node 114. Thus, the value of the current supplied to the common node 114 corresponds to an indication of that die's power consumption value. The combined currents from the dice 114 results in a cumulative analog current at the common node 114.

At operation 804, with each processing device generating its respective die's power consumption, the resultant cumulative analog current driven onto the common node 114 by all of the dice 112 corresponds to a value indicative of the total power consumption by the dice in the package.

Figure 9:
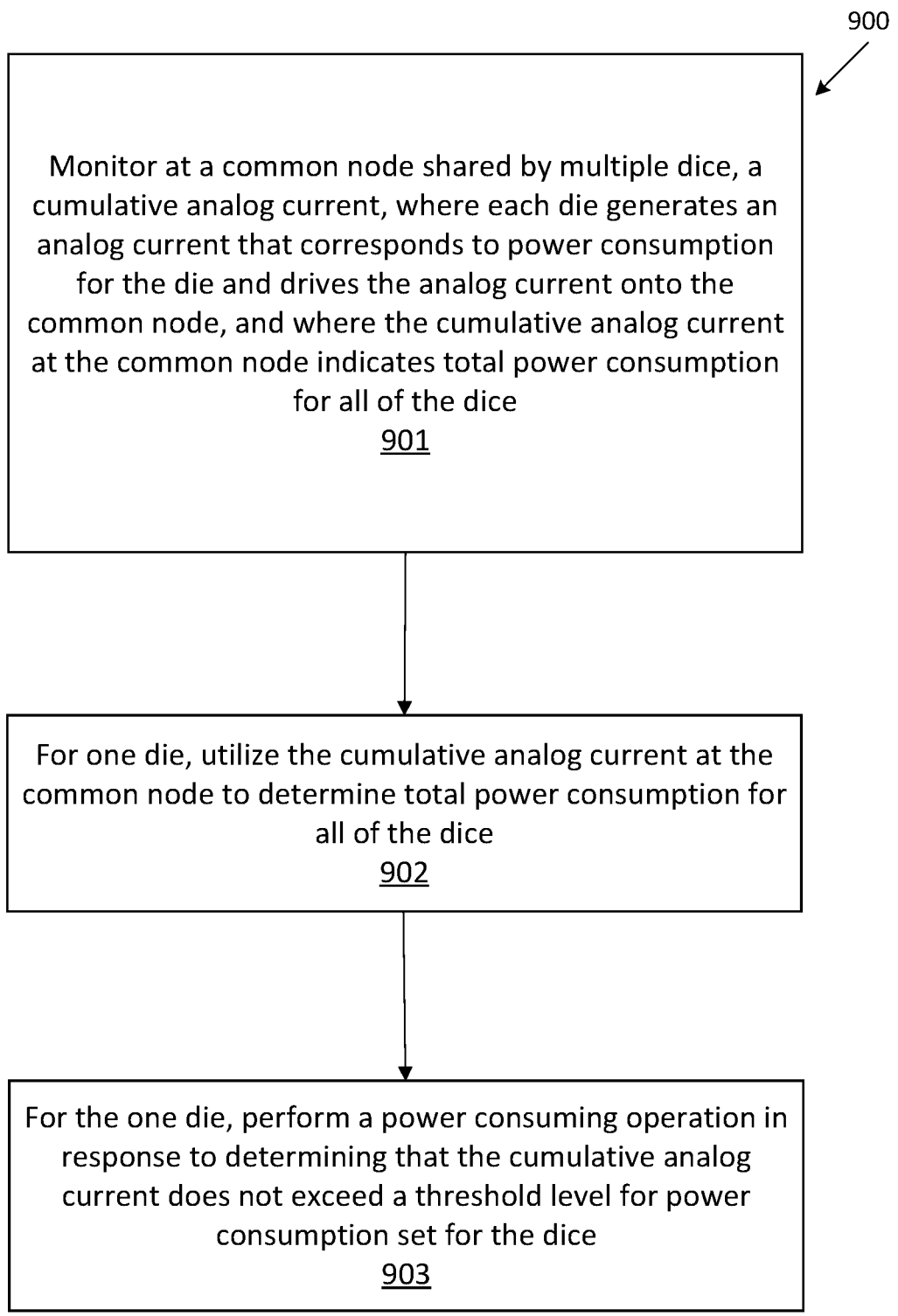
FIG. 9 is a flow diagram of an example method to manage power consumption for one die of multiple dice, by monitoring a common node that utilizes current summation to determine the total power consumption for the multiple dice, in order to perform a power consuming operation, in accordance with some embodiments of the present disclosure.

FIG. 9 is a flow diagram of an example method 900 to manage power consumption for one die of multiple dice, by monitoring a common node that utilizes current summation to determine the total power consumption for the multiple dice, in order to perform a power consuming operation, in accordance with some embodiments of the present disclosure. The method 900 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the PML 113 of FIG. 1 performs the method 900. In some embodiments, the circuitry of FIG. 10 performs the method 900. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 901, each processing device (e.g., the PML 113) of the dice 112 contained in the package monitors the common node 114 shared by the dice. For example, each processing device monitors the cumulative analog current on the common node 114 that indicates total power consumption for all of the dice 112 in the package. In some embodiments, the method 800 of FIG. 8 provides the technique for using an analog current that corresponds to the power consumption for that respective die 112. The total of the currents, when summed, provides an indication of the total power consumption for the dice 112.

At operation 902, the processing device of one die 112 utilizes the cumulative analog current at the common node 114 to determine the indicated total power consumption for the dice 112 of the package. In one embodiment, the PML 113 sums the analog currents using a current summation amplifier.

At operation 903, the processing device determines if an operation that the die 112 is about to perform will exceed a threshold value for power consumption. In some embodiments, the threshold level is the peak power level set for all of the dice 112 of the package operating on the power network. Because the die 112 has indicated its current power consumption (e.g., the method 800) onto the common node 114, along with indications of other dice, the processing device knows the total power consumption for the package. The processing device can determine if the required power for the intended operation, when considered with the cumulative analog current value on the common node 114, will exceed the threshold. In one embodiment, the processing device uses a lookup table or other data structure to map an operation with a digital or analog value corresponding to the operation. If the potential increase in the power consumption can result in the total power exceeding the threshold value, the die 112 does not perform the operation, delays performing the operation, or performs a lower-power version of the operation. If the potential increase in the power consumption cannot, or most likely will not, exceed the threshold value, the die 112 performs the operation. When performing the operation, the PML 113 of the die 112 updates the die's power consumption indication on the common node 114 to reflect the new power consumption value for the die 112 in performing the operation. In some embodiments, the processing device of the die 112 updates the die's power consumption indication onto the common node 114 prior to performing the operation, in order to advertise or reserve power for the operation to prevent another die from executing another power consuming operation.

Figure 10:
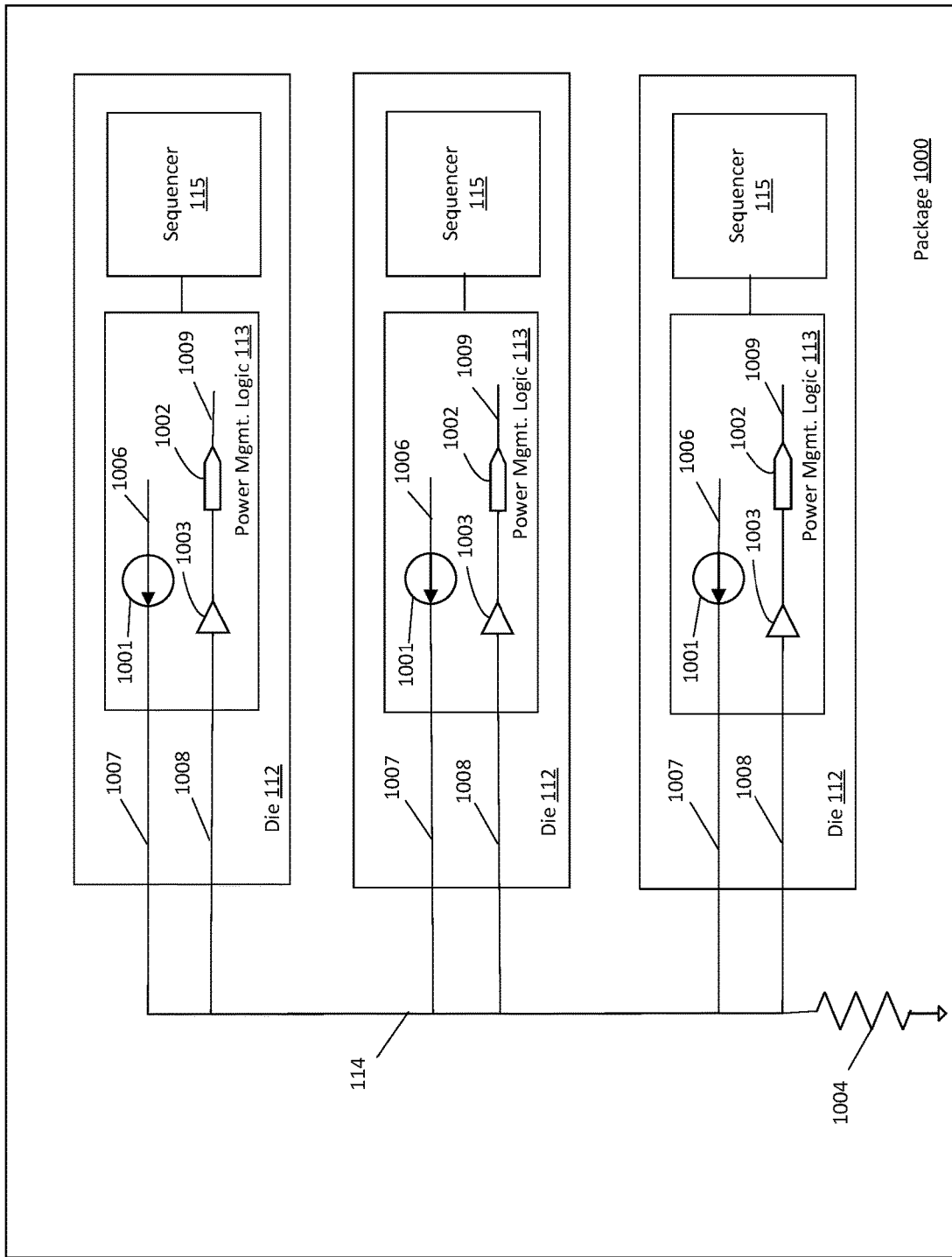
FIG. 10 is a block diagram of an example package that contains multiple dice, each die having a power management logic to perform the methods of FIG. 8 and/or FIG. 9, in accordance with some embodiments of the present disclosure.

FIG. 10 is a block diagram of an example package 1000 that contains multiple dice, each die having a PML to perform the methods of FIG. 8 and/or FIG. 9. The package 1000 shows only three dice 112, however, the actual number present can vary depending on the design. Each die includes a sequencer 115, along with the PML 113. Each sequencer 115 is responsible for sequencing the various memory operations performed within its respective die. Such operations including the scheduling and performing of read, program, and erase operations related to memory cells. The PML 113 manages the power related operations for the die 112. In some embodiments, the PML 113 and sequencer 115 are separate components. In some embodiments, the PML 113 and sequencer 115 are a combined component. In some embodiments, the sequencers 115 of the dice 112 can communicate with one another. Each PML 113 couples to the common node 114.

In operation, the PML 113 of each die 112 determines an amount of power consumption for operating its respective die. In some embodiments, the sequencer 115 can provide information to make the determination about power consumption. The power consumption for the die 112 is dependent on the activity of the die. When in a higher current state, such as for performing a program, read, or error operation, the power consumption is higher than when in a non-activity state. The PML 113 can use a variety of techniques to determine the power consumption for its die 112. In one technique, current measurement (e.g., supply current) provides an indication of die's power consumption.

Each PML 113 generates a signal that corresponds to the power consumption for its die 112. The PML 113 can generate one of a variety of signals corresponding to power consumption, including voltage or current and analog or digital. In one embodiment, the signal on line 1006 is a current signal. In one embodiment, the current signal can be the supply current (or a fraction of the supply current) drawn by the die to indicate the power consumption. In some embodiments, the sequencer 115 can provide the signal of line 1006 to the PML 113.

Each PML 113 drives the analog signal to drive the common node 114. For the embodiment that employs a current signal, a current source 1001 drives an analog current onto line 1007, which connects to the common node 114. Thus, the value of the analog current supplied to the common node 114 corresponds to an indication of the die's power consumption value. With each PML 113 generating its respective die's power consumption indication on line 1007, the resultant cumulative analog current on the common node 114 by all of the dice 112 corresponds to a value indicative of the total power consumption by the dice in the package.

To manage power consumption for each die 112, each PML 113 monitors the cumulative analog current on the common node 114. In some embodiments, a designated pin or terminal on each die 112 connects to line 1008 to the common node 114. In some embodiments, a resistor 1004 connects the common node 114 to a return path, such as ground. Resistor 1004 can reside inside the package or outside of the package. A PML 113 of one die 112 utilizes the summed current of the common node 114 to determine the indicated total power consumption for the dice 112 of the package 1000. In one embodiment, the PML 113 sums the current using a current summation amplifier 1003 connected to line 1008, converts the analog value to a digital value by use of an analog-to-digital converter 1002, and outputs the digital signal on line 1009. The PML 113 can pass this information on line 1009 to the sequencer 115.

The PML 113 determines if a next operation that its die 112 is about to perform will exceed a certain threshold value for power consumption. In some embodiments, the threshold level is the peak power level set for all of the dice 112 of the package operating on the power network. Because the die 112 has indicated its current power consumption onto the common node 114, along with indications of other dice, the PML 113 knows the total power consumption for the package. The PML 113 can determine if the required power for the next operation, when considered with the cumulative analog current value on the common node 114, will exceed the threshold. If the potential increase in the power consumption can result in the total power exceeding the threshold value, the die 112 does not perform the operation, delays performing the operation, or performs a lower-power version of the operation. If the potential increase in the power consumption cannot, or most likely will not, exceed the threshold value, the die 112 performs the operation. When performing the operation, the PML 113 of the die 112 updates the die's power consumption indication on the common node 114 to reflect the new power consumption value for the die 112 in performing the operation. In some embodiments, the PML 113 of the die 112 updates the die's power consumption indication onto the common node 114 prior to performing the operation, in order to advertise or reserve power for the operation to prevent another die from executing another power consuming operation. In some embodiments, the sequencer 115 can perform some or all of the operational functions, or aid in the performance of the operational functions of the die 112.

The circuitry of FIG. 10 allows for analog control over the power management of the dice 112 in the package 1000. Analog voltage and/or current monitoring at a common node 114 allows each die 112 to determine the current power consumption of the package 1000, so that each individual die can decide on which memory operation(s) it can currently perform, based on the monitored total power consumption value. When a die cannot acquire adequate power to perform an operation, in some embodiments, the die 112 can delay performing the operation until power is available or perform a lower-power version of the operation. Furthermore, the circuitry of FIG. 10 can contain compensation devices/circuits/logic to adjust for process, temperature and/or voltage (PVT) fluctuations. PVT compensation allows for accurate performance of the PML 113 over fluctuating PVT conditions.

Figure 11:
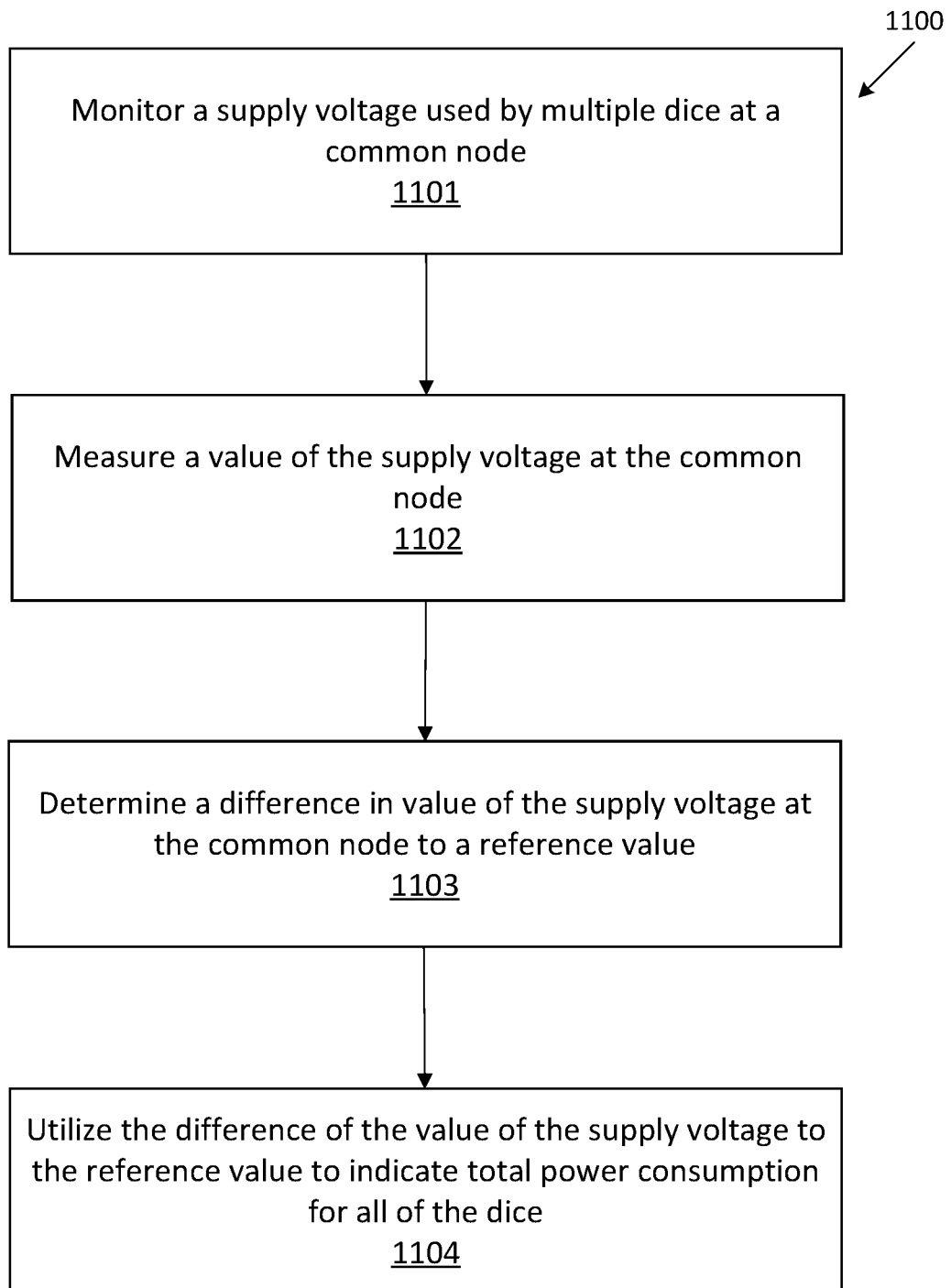
FIG. 11 is a flow diagram of an example method to manage power consumption for multiple dice in a package and operating from a power network, by monitoring a fluctuation of a supply voltage at a common node, in accordance with some embodiments of the present disclosure.

FIG. 11 is a flow diagram of an example method 1100 to manage power consumption for multiple dice in a package and operating from a power network, by monitoring a fluctuation of a supply voltage at a common node, in accordance with some embodiments of the present disclosure. The method 1100 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the PML 113 of FIG. 1 performs the method 1100 (the PML 113 and other processing logic collectively referred to as "processing device" below). In some embodiments, the circuitry of FIG. 13 performs the method 1100. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 1101, the processing device (e.g., the PML 113) of each die 112 does not generate a signal indicative of that die's power consumption. Instead, each PML 113 monitors a supply voltage that provides power to the dice 112 of the package. The supply voltage has a nominal or reference value when the dice 112 of a package consume minimal power. As one or more die/dice 112 begins to consume power by performing memory operations, the additional current drawn on the supply causes a voltage drop on the supply line. This variation can be the ripple effect experienced by the supply line as die/dice 112 draws additional current from the supply.

At operation 1102, each processing device measures the supply voltage value at the common node. In one embodiment, a voltage detector connected to the common node 114 can detect the voltage at the common node. Because the total current drawn by the dice corresponds to total power consumption for the package and because the voltage drop has a proportional relationship to the current drawn from the supply, the total voltage drop from the nominal or reference value measured at the common node, gives a good indication of the total power consumption for the dice 112 in the package.

At operation 1103, the processing device can determine the difference in the voltage drop or ripple on the common node 114 from the nominal or reference value. With each processing device generating its respective die's power consumption, the resultant voltage driven onto the common node by all of the dice 112 corresponds to a value indicative of the total power consumption by the dice in the package.

At operation 1104, the processing device can utilize this difference in the voltage drop or ripple on the common node 114 from the nominal or reference value to indicate the total power consumption for the dice 112 in the package.

Figure 12:
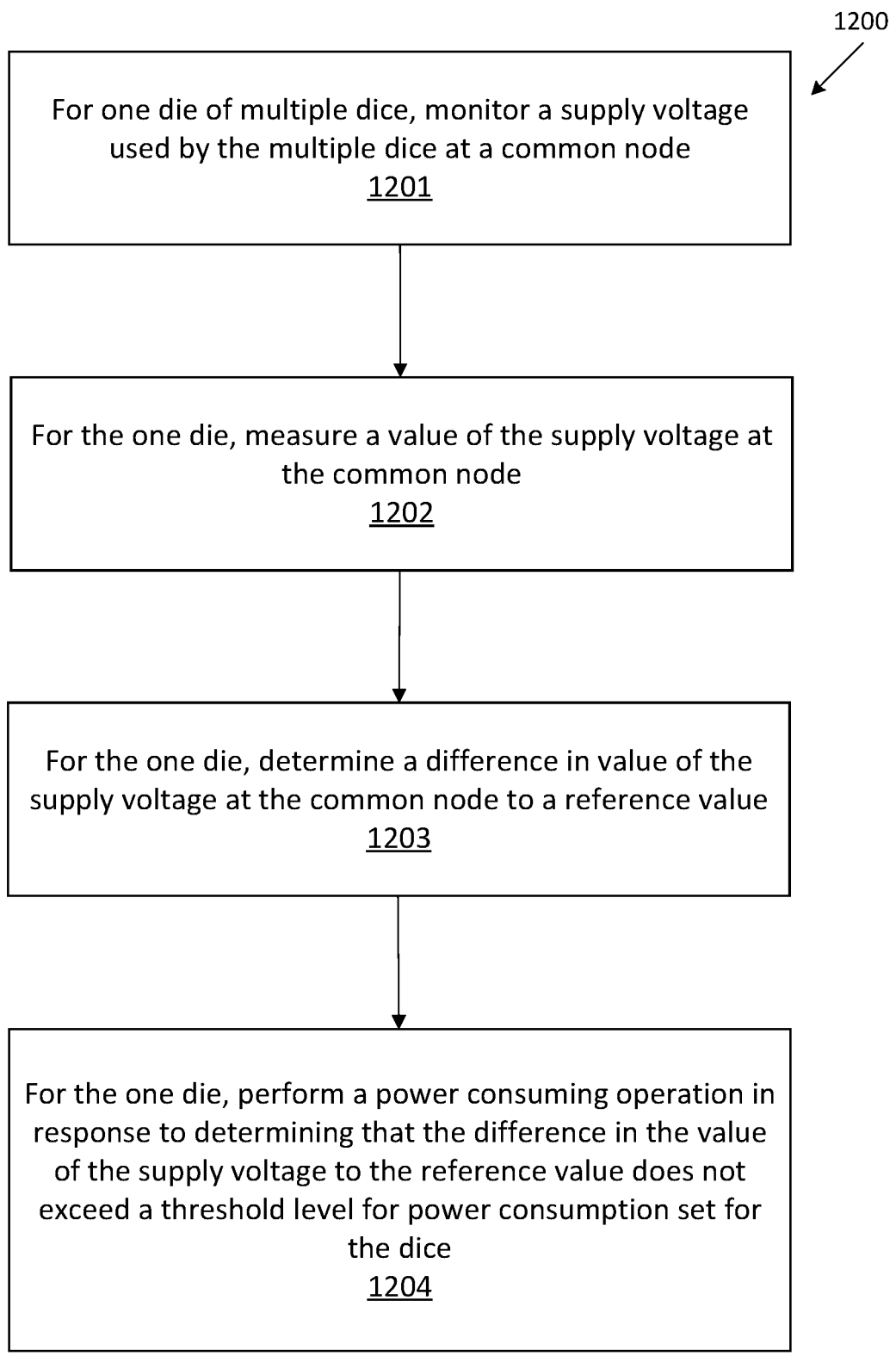
FIG. 12 is a flow diagram of an example method to manage power consumption for one die of multiple dice, by monitoring a fluctuation of a supply voltage at a common node to determine the total power consumption for the multiple dice, in order to perform a power consuming operation, in accordance with some embodiments of the present disclosure.

FIG. 12 is a flow diagram of an example method 1200 to manage power consumption for one die of multiple dice, by monitoring a fluctuation of a supply voltage at a common node to determine the total power consumption for the multiple dice, in order to perform a power consuming operation, in accordance with some embodiments of the present disclosure. The method 1200 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the PML 113 of FIG. 1 performs the method 1200. In some embodiments, the circuitry of FIG. 13 performs the method 1200. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 1201, each processing device (e.g., the PML 113) of the dice 112 contained in the package monitors a supply voltage at the common node 114 shared by the dice. The supply voltage supplies power to the power network used by the dice 112 in the package. Each processing device monitors a value of the supply voltage on the common node 114. In some embodiments, the method 1100 of FIG. 11 provides the technique for monitoring the supply voltage and interpreting the value of the supply voltage on the common node 114 as an indication of total power consumption value of the dice 112.

At operation 1202, the processing device of one die 112 measures the voltage of the common node 114 to determine the indicated total power consumption for the dice of the package. In some embodiments the processing device uses a voltage detector to perform the measurement.

At operation 1203, the processing device determines a difference in value of the measured supply voltage at the common node 114 to a nominal or reference value for the supply voltage. In some embodiments, the change in the value of the supply voltage is the ripple induced in the supply voltage, which ripple corresponds to the amount of current drawn from the supply by the dice 112.

At operation 1204, the processing device determines if an operation that its die 112 is about to perform will exceed a threshold value for power consumption. In some embodiments, the threshold level is the peak power level set for all of the dice 112 of the package operating on the power network. Because the die 112 has indicated its current power consumption (e.g., the method 1100) by a change in the supply voltage, along with changes induced by the other dice, the processing device knows the total power consumption for the package. The processing device can determine if the required power for the intended operation, when considered with the supply voltage value at the common node 114, will exceed the threshold. In one embodiment, the processing device uses a lookup table or other data structure to map an operation with a digital or analog value corresponding to the operation. If the potential increase in the power consumption can result in the total power exceeding the threshold value, the die 112 does not perform the operation, delays performing the operation, or performs a lower-power version of the operation. If the potential increase in the power consumption cannot, or most likely will not, exceed the threshold value, the die 112 performs the operation. When performing the operation, the PML 113 of the die 112 will update the die's power consumption indication on the common node 114, by causing a change in the supply voltage, to reflect the new power consumption value for the die.

Figure 13:
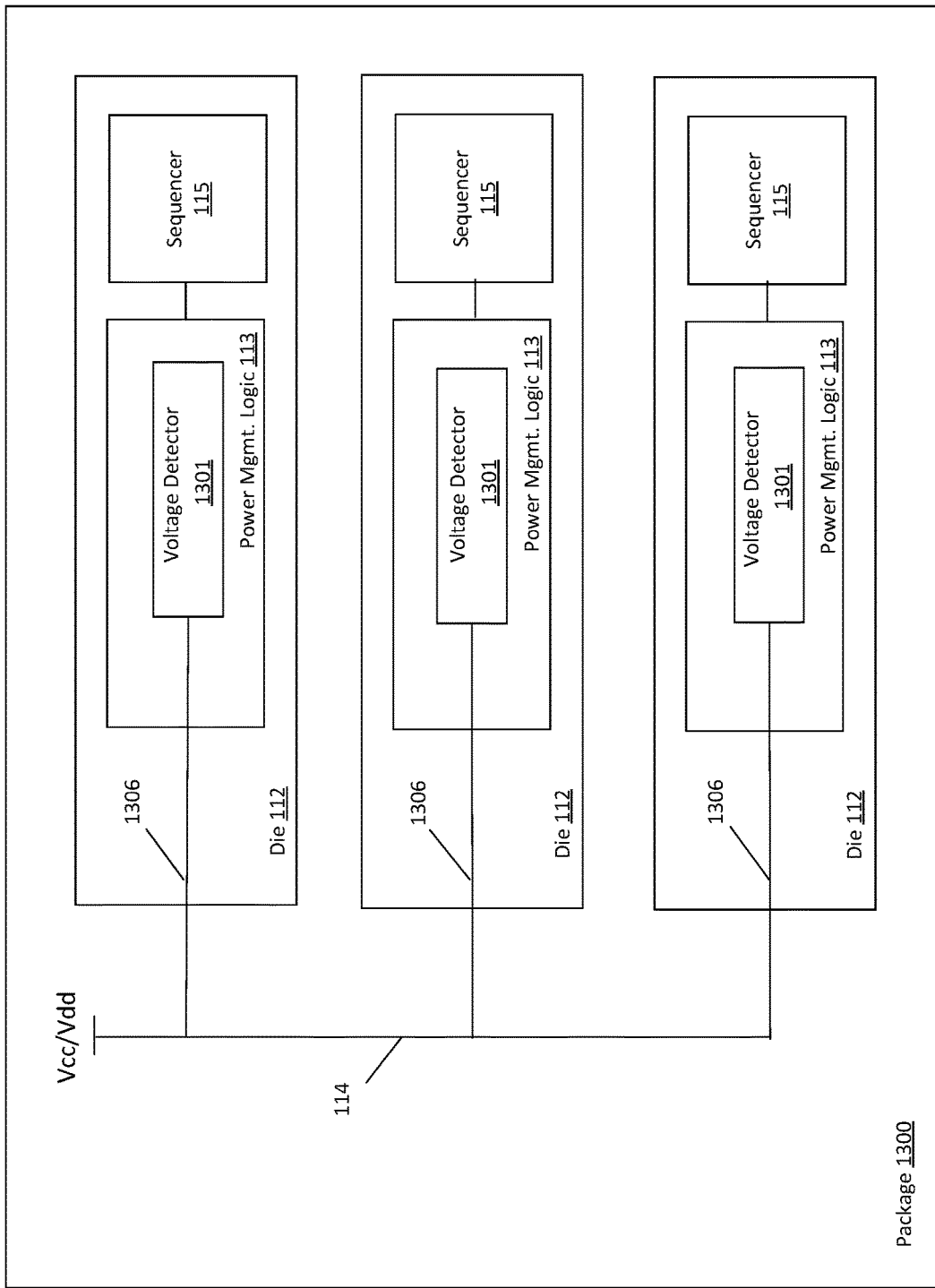
FIG. 13 is a block diagram of an example package that contains multiple dice, each die having a power management logic to perform the methods of FIG. 11 and/or FIG. 12, in accordance with some embodiments of the present disclosure.

FIG. 13 is a block diagram of an example package 1300 that contains multiple dice, each die having a PML to perform the methods of FIG. 11 and/or FIG. 12. The package 1300 shows only three dice 112, however, the actual number present can vary depending on the design. Each die includes a sequencer 115, along with the PML 113. Each sequencer 115 is responsible for sequencing the various memory operations performed within its respective die 112. Such operations including the scheduling and performing of read, program, and erase operations related to memory cells. The PML 113 manages the power related operations for the die 112. In some embodiments, the PML 113 and sequencer 115 are separate components. In some embodiments, the PML 113 and sequencer 115 are a combined component. In some embodiments, the sequencers 115 of the dice 112 can communicate with one another. Each PML 113 couples to the common node 114 via line 1306. In some embodiments, a designated pin or terminal on each die connects line 1306 to the common node 114.

In operation, PML 113 of each die 112 does not generate a signal indicative of that die's power consumption. Instead, each PML 113 monitors, at the common node, a supply voltage (e.g., Vcc/Vdd) that provides power to the dice 112 of the package 1300. The supply voltage has a nominal or reference value when the dice 112 of the package 1300 consume minimal power. As one or more die/dice 112 begins to consume power by performing memory operations, the additional current drawn on the supply causes a voltage drop on the supply line. This variation can be the ripple effect experienced by the supply line as die/dice draws additional current from the supply.

Each PML 113 measures the supply voltage value at the common node 144. In one embodiment, a voltage detector 1301 connected to the common node 114, via line 1306, can detect the voltage at the common node. Because the total current drawn by the dice 112 corresponds to total power consumption for the package 1300 and because the voltage drop has a proportional relationship to the current drawn from the supply, the voltage drop from the nominal or reference value measured at the common node, gives a good indication of the total power consumption for the dice 112 in the package 1300. Each PML 113 can determine the difference in the voltage drop or ripple on the common node 114 from the nominal or reference value. Each PML 113 can utilize this difference in the voltage drop or ripple from the nominal or reference value to indicate the total power consumption of the dice 112 in the package 1300.

Each PML 113 of the dice 112 contained in the package 1300 monitors the supply voltage at the common node 114. The voltage detector 1301 of a PML 113 of one die 112 measures the voltage of the common node 114 to determine the indicated total power consumption for the dice 112 of the package 1300. The PML determines a difference in value of the measured supply voltage at the common node 114 to a nominal or reference value for the supply voltage. As noted above, in some embodiments, the change in the value of the supply voltage is the ripple induced in the supply voltage, which ripple corresponds to the amount of current drawn from the supply by the dice 112.

The PML 113 determines if the next operation that the die 112 is about to perform will exceed a threshold value for power consumption. In some embodiments, the threshold level is the peak power level set for all of the dice 112 of the package 1300 operating on the power network. Because the PML 113 knows the total power consumption for the package, the PML 113 can determine if the required power for the next operation, when considered with the supply voltage value on the common node 114, will exceed the threshold. If the potential increase in the power consumption can result in the total power exceeding the threshold value, the die 112 does not perform the operation, delays performing the operation, or performs a lower-power version of the operation. If the potential increase in the power consumption cannot, or most likely will not, exceed the threshold value, the die 112 performs the operation. When performing the operation, the power consumption for that die 112 increases due to additional current drawn from the supply, which increase in the power consumption results in additional change in the voltage (e.g., ripple) introduced in the supply voltage and noted at the common node 114.

The circuitry of FIG. 13 allows for analog control over the power management of the dice 112 in the package 1300. Analog voltage and/or current monitoring at common node 114 allows each die 112 to determine the current power consumption of the package 1300, so that each individual die 112 can decide on which memory operation(s) it can currently perform, based on the monitored total power consumption value. Furthermore, the circuitry of FIG. 13 can contain compensation devices/circuits/logic to adjust for process, temperature and/or voltage (PVT) fluctuations. PVT compensation allows for accurate performance of the PML 113 over fluctuating PVT conditions.

Figure 14:
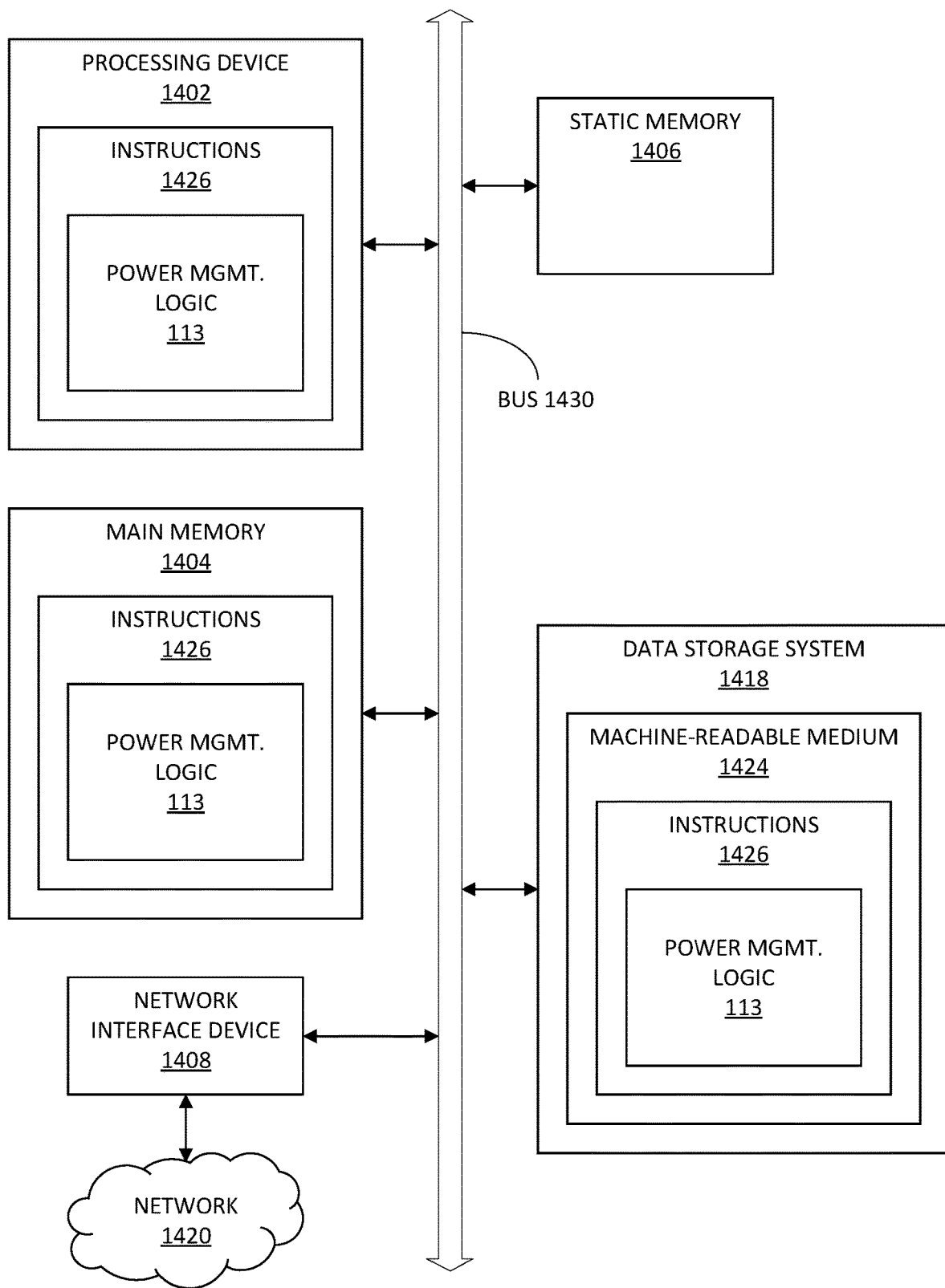
FIG. 14 is a block diagram of an example computer system in which embodiments of the present disclosure may operate, in accordance with some embodiments of the present disclosure.

FIG. 14 illustrates an example machine of a computer system within which a set of instructions, for causing the machine to perform any one or more of the methodologies discussed herein, can be executed. In some embodiments, the computer system of FIG. 14 can correspond to a host system (e.g., the host system 120 of FIG. 1) that includes, is coupled to, or utilizes a memory subsystem (e.g., the memory subsystem 110 of FIG. 1) or can be used to perform the operations of a controller (e.g., to execute an operating system to perform operations corresponding to the PML 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system includes a processing device 1402, a main memory 1404 (e.g., read-only memory (ROM), flash memory, dynamic random access memory (DRAM) such as synchronous DRAM (SDRAM) or Rambus DRAM (RDRAM), etc.), a static memory 1406 (e.g., flash memory, static random access memory (SRAM), etc.), and a data storage system 1418, which communicate with each other via a bus 1430.

Processing device 1402 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 1402 can also be one or more special-purpose processing devices such as an application specific integrated circuit (ASIC), a field programmable gate array (FPGA), a digital signal processor (DSP), network processor, or the like. The processing device 1402 is configured to execute instructions 1426 for performing the operations and steps discussed herein. The computer system can further include a network interface device 1408 to communicate over the network 1420.

The data storage system 1418 can include a machine-readable storage medium 1424 (also known as a computer-readable medium) on which is stored one or more sets of instructions 1426 or software embodying any one or more of the methodologies or functions described herein. The instructions 1426 can also reside, completely or at least partially, within the main memory 1404 and/or within the processing device 1402 during execution thereof by the computer system 1400, the main memory 1404 and the processing device 1402 also constituting machine-readable storage media. The machine-readable storage medium 1424, data storage system 1418, and/or main memory 1404 can correspond to the memory subsystem 110 of FIG. 1.

In one embodiment, the instructions 1426 include instructions to implement functionality corresponding to a power manager or power management logic (e.g., the PML 113 of FIG. 1). While the machine-readable storage medium 1424 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general-purpose computer selectively activated or reconfigured by a computer program stored in the computer. For example, a computer system or other data processing system, such as a memory component 112, may carry out the computer-implemented methods described herein in response to its processor executing a computer program (e.g., a sequence of instructions) contained in a memory or other non-transitory machine-readable storage medium. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general-purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method comprising:
    determining for each respective die of a plurality of dice, power consumption for operating each respective die;
    generating a respective signal from each respective die that corresponds to the power consumption of each respective die;
    converting each respective signal to a respective analog voltage to drive a common node; and
    utilizing a charge storage device coupled to the common node to accumulate the respective analog voltages from the plurality of dice, the accumulated voltage to indicate total power consumption of the plurality of dice.

2. The method of claim 1, further comprising comparing the accumulated voltage to a threshold level for power consumption set for the plurality of dice.

3. The method of claim 2, wherein the threshold level is peak power consumption for the plurality of dice.

4. The method of claim 2, further comprising, for at least one die, performing a power consuming operation in response to determining that the accumulated voltage does not exceed the threshold level.

5. The method of claim 1, wherein the respective signals are current signals and converting each respective current signal to the respective analog voltage to drive the common node includes using a transimpedance amplifier to perform the converting.

6. The method of claim 1, wherein the charge storage device is a capacitor that resides within a package containing the plurality of dice.

7. The method of claim 1, wherein the charge storage device is a capacitor that resides outside of a package containing the plurality of dice.

8. A non-transitory computer-readable storage medium comprising instructions that, when executed by a processing device, cause the processing device to perform operations comprising:
 determining for each respective die of a plurality of dice, power consumption for operating each respective die;
 generating a respective signal from each respective die that corresponds to the power consumption of each respective die;
 converting each respective signal to a respective analog voltage to drive a common node; and
 utilizing a charge storage device coupled to the common node to accumulate the respective analog voltages from the plurality of dice, the accumulated voltage to indicate total power consumption of the plurality of dice.

9. The non-transitory computer-readable storage medium of claim 8, wherein the operations further comprise comparing the accumulated voltage to a threshold level for power consumption set for the plurality of dice.

10. The non-transitory computer-readable storage medium of claim 9, wherein the threshold level is peak power consumption for the plurality of dice.

11. The non-transitory computer-readable storage medium of claim 9, wherein the operations further comprise, for at least one die, performing a power consuming operation in response to determining that the accumulated voltage does not exceed the threshold level.

12. The non-transitory computer-readable storage medium of claim 8, wherein the respective signals are current signals and wherein converting each respective current signal to the respective analog voltage to drive the common node includes using a transimpedance amplifier to perform the converting.

13. A system comprising:
 a plurality of dice, in which each die of the plurality of dice contains one or more non-volatile memory components, wherein each die includes a power management logic to:
  determine power consumption for operating each respective die;
  generate a respective signal that corresponds to the power consumption of the die; and
  convert the respective signal to a respective analog voltage to drive a common node; and
 a charge storage device coupled to the common node that accumulates the respective analog voltages from the plurality of dice, the accumulated voltage indicating total power consumption of the plurality of dice.

14. The system of claim 13, wherein each of the plurality of dice compares the accumulated voltage to a threshold level for power consumption set for the plurality of dice.

15. The system of claim 14, wherein the threshold level is peak power consumption for the plurality of dice.

16. The system of claim 13, wherein the charge storage device is a capacitor and the system further includes a resistive component coupled to the common node to provide a leakage path for the capacitor, and wherein the capacitor and the resistive component reside within a package that includes the plurality of dice.

17. The system of claim 13, wherein the charge storage device is a capacitor and the system further includes a resistive component coupled to the common node to provide a leakage path for the capacitor, wherein the capacitor and the resistive component reside outside of a package that includes the plurality of dice.

18. The system of claim 13, wherein the respective signals are current signals.

19. The system of claim 18, wherein each respective die further includes a transimpedance amplifier to convert a respective current signal to a respective analog voltage to drive the common node.

20. The system of claim 13, wherein each power management logic adjusts the respective analog voltage for supply voltage and temperature fluctuations.

* * * * *